US011652109B2

United States Patent
Baek et al.

(10) Patent No.: US 11,652,109 B2
(45) Date of Patent: May 16, 2023

(54) HIGH-RESOLUTION DISPLAY APPARATUS WITH LOW-RESISTANCE WIRING

(71) Applicant: SAMSUNG DISPLAY CO., LTD., Yongin-si (KR)

(72) Inventors: Gyungmin Baek, Yongin-si (KR); Hyuneok Shin, Yongin-si (KR); Juhyun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 154 days.

(21) Appl. No.: 17/136,603

(22) Filed: Dec. 29, 2020

(65) Prior Publication Data

US 2021/0242249 A1 Aug. 5, 2021

(30) Foreign Application Priority Data

Feb. 3, 2020 (KR) .................. 10-2020-0012624

(51) Int. Cl.
*H01L 29/08* (2006.01)
*H01L 27/12* (2006.01)
*H01L 27/32* (2006.01)

(52) U.S. Cl.
CPC ...... *H01L 27/1225* (2013.01); *H01L 27/3258* (2013.01); *H01L 27/3262* (2013.01); *H01L 27/3265* (2013.01)

(58) Field of Classification Search
CPC ............. H01L 27/1225; H01L 27/3258; H01L 27/3262; H01L 27/3265
USPC .......................................................... 257/40
See application file for complete search history.

(56) References Cited

U.S. PATENT DOCUMENTS

| 6,338,988 B1 | 1/2002 | Andry et al. |
| 7,511,309 B2 | 3/2009 | Shin |
| 9,024,323 B2 | 5/2015 | Oh et al. |
| 2005/0057580 A1 | 3/2005 | Yamano et al. |
| 2007/0215867 A1* | 9/2007 | Kawakami ............ C07C 211/61 257/40 |
| 2008/0093602 A1* | 4/2008 | Matsumura ......... H01L 29/4908 257/E27.113 |
| 2012/0104405 A1* | 5/2012 | Choi ..................... H01L 27/124 438/34 |

(Continued)

FOREIGN PATENT DOCUMENTS

| KR | 100345527 B1 | 7/2002 |
| KR | 100572429 B1 | 4/2006 |
| KR | 100731739 B1 | 6/2007 |

(Continued)

*Primary Examiner* — Phuc T Dang
(74) *Attorney, Agent, or Firm* — Cantor Colburn LLP

(57) ABSTRACT

A display apparatus includes a substrate; a thin-film transistor on the substrate, where the thin-film transistor includes a semiconductor layer and a gate electrode overlapping the semiconductor layer with a first insulating layer between the gate electrode and the semiconductor layer; and a display element electrically connected to the thin-film transistor. The gate electrode includes a first lower layer and a first upper layer on the first lower layer and including a different material from the first lower layer. The first lower layer has a first thickness from an upper surface of the first insulating layer, and the first upper layer has a second thickness from an upper surface of the first lower layer, where the second thickness is greater than the first thickness.

22 Claims, 16 Drawing Sheets

(56) References Cited

U.S. PATENT DOCUMENTS

2016/0064462 A1* 3/2016 Yoon ................ H01L 29/78645
257/40

FOREIGN PATENT DOCUMENTS

KR  1020130110490 A  10/2013
KR  101362156 B1  2/2014

* cited by examiner

HIGH-RESOLUTION DISPLAY APPARATUS WITH LOW-RESISTANCE WIRING

This application claims priority to Korean Patent Application No. 10-2020-0012624, filed on Feb. 3, 2020, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus in which resistance with respect to a gate electrode of a thin film transistor and/or to an electrode of a storage capacitor is improved.

2. Description of the Related Art

A display apparatus may visually display image data. Such a display apparatus may be used as a display element in small products, such as mobile phones, and may be also used as a display element in large products, such as televisions.

Such a display apparatus typically includes a substrate including a display area and a non-display area. Gate lines and data lines may be arranged in the display area to be insulated from each other. Pixel areas may be defined at intersections between the gate lines and the data lines in the display area, and the pixel areas emit light by receiving an electrical signal to display images to the outside. A thin film transistor and a pixel electrode electrically connected to the thin film transistor may be provided corresponding to each of the pixel areas, and an opposite electrode may be commonly provided in the pixel areas. The non-display area may include various wires for transferring electrical signals to the display area, a gate driver, a data driver, and a controller, for example.

As display apparatuses have been more widely used in various field, quality improvement of display apparatuses is further desired. As the resolution of display apparatuses becomes high, research is being actively conducted to improve quality.

SUMMARY

One or more embodiments include a display apparatus in which resistance of a gate electrode of a thin film transistor and/or to an electrode of a storage capacitor is improved.

According to an embodiment, a display apparatus includes a substrate; a thin-film transistor on the substrate, where the thin-film transistor includes a semiconductor layer and a gate electrode overlapping the semiconductor layer with a first insulating layer between the gate electrode and the semiconductor layer; and a display element electrically connected to the thin-film transistor. In such an embodiment, the gate electrode includes a first lower layer and a first upper layer on the first lower layer and including a different material from the first lower layer. In such an embodiment, the first lower layer has a first thickness from an upper surface of the first insulating layer, and the first upper layer has a second thickness from an upper surface of the first lower layer, where the second thickness is greater than the first thickness.

In an embodiment, the first lower layer may include tungsten (W) or a tungsten alloy, the first upper layer may include molybdenum (Mo), the first thickness may be in a range of about 250 angstrom (Å) to about 1200 Å, and the second thickness may be in a range of about 2000 Å to about 7000 Å.

In an embodiment, the tungsten alloy of the first lower layer may include tungsten (W) and a first element, a content of the first element of the tungsten alloy may be less than about 50 wt %, and the first element may be selected from titanium (Ti), zirconium (Zr) and hafnium (Hf).

In an embodiment, the display apparatus may further include a storage capacitor, where the storage capacitor may include: the gate electrode; and an upper electrode overlapping the gate electrode with a second insulating layer between the upper electrode and the gate electrode.

In an embodiment, the upper electrode may include: a second lower layer; and a second upper layer on the second lower layer and including a different material from the second lower layer, the second lower layer may have a third thickness from an upper surface of the second insulating layer, and the second upper layer may have a fourth thickness from an upper surface of the second lower layer, where the fourth thickness may be greater than the third thickness.

In an embodiment, the second lower layer may include tungsten (W) or a tungsten alloy, the first upper layer may include molybdenum (Mo), the first thickness may be in a range of about 250 Å to about 1200 Å, and the second thickness may be in a range of about 2000 Å to about 7000 Å.

In an embodiment, the tungsten alloy of the second lower layer may include tungsten (W) and a second element, a content of the second element of the tungsten alloy may be less than about 50 wt %, and the second element may be selected from titanium (Ti), zirconium (Zr) and hafnium (Hf).

In an embodiment, the display apparatus may further include a storage capacitor, where the storage capacitor may include: a lower electrode on the substrate; and an upper electrode overlapping the lower electrode with a second insulating layer between the upper electrode and the lower electrode.

In an embodiment, the lower electrode may be spaced apart from the gate electrode.

In an embodiment, the gate electrode may further include: a third lower layer on the first upper layer; and a third upper layer on the third lower layer and including a different material from the third lower layer, the third lower layer may have a fifth thickness from an upper surface of the first upper layer, and the third upper layer may have a sixth thickness from an upper surface of the third lower layer, where the sixth thickness may be greater than the fifth thickness.

In an embodiment, each of the first thickness and the fifth thickness may be in a range of about 250 Å to about 600 Å, and each of the second thickness and the sixth thickness may be in a range of about 2000 Å to about 3500 Å.

In an embodiment, the display element may include a pixel electrode electrically connected to the thin-film transistor; an intermediate layer on the pixel electrode; and an opposite electrode on the intermediate layer.

In an embodiment, the substrate may include a glass material or a polymer resin.

According to an embodiment, a display apparatus includes a substrate; a first insulating layer on the substrate; and a gate electrode on the first insulating layer, where the gate electrode includes: a plurality of first lower layers including tungsten (W) or a tungsten alloy; and a plurality of first upper layers including molybdenum (Mo). In such an embodiment, the plurality of first lower layers alternate with the plurality of first upper layers, and one of the plurality of first lower layers is closest to the substrate.

In an embodiment, a thickness of each of the plurality of first upper layers may be greater than a thickness of each of the plurality of first lower layers.

In an embodiment, a thickness of the gate electrode may be in a range of about 2250 Å to about 8200 Å.

In an embodiment, the tungsten alloy of the gate electrode may include tungsten (W) and a first element, a content of the first element of the tungsten alloy may be less than about 50 wt %, and the first element may be selected from titanium (Ti), zirconium (Zr) and hafnium (Hf).

In an embodiment, the display apparatus may further include a storage capacitor, where the storage capacitor may include: the gate electrode; and an upper electrode overlapping the gate electrode with a second insulating layer between the upper electrode and the gate electrode.

In an embodiment, the upper electrode may be on the second insulating layer, the upper electrode may include: a plurality of second lower layers including tungsten (W) or a tungsten alloy; and a plurality of second upper layers including molybdenum (Mo), the plurality of second lower layers may be alternately stacked with the plurality of second upper layers, and one of the plurality of second lower layers may be closest to the substrate.

In an embodiment, a thickness of each of the plurality of second upper layers may be greater than a thickness of each of the plurality of second lower layers.

In an embodiment, a thickness of the upper electrode may be in a range of about 2250 Å to about 8200 Å.

In an embodiment, the tungsten alloy of the upper electrode may include tungsten (W) and a second element, an amount of the second element in the tungsten alloy may be less than about 50 wt %, and the second element may be selected from titanium (Ti), zirconium (Zr) and hafnium (Hf).

In an embodiment, the display apparatus may further include a storage capacitor, where the storage capacitor may include: a lower electrode on the substrate; and an upper electrode overlapping the lower electrode with a second insulating layer between the upper electrode and the lower electrode.

In an embodiment, the lower electrode may be spaced apart from the gate electrode.

These and/or other features of embodiments of the invention will become apparent and more readily appreciated from the following description of the embodiments, the claims, and the accompanying drawings.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
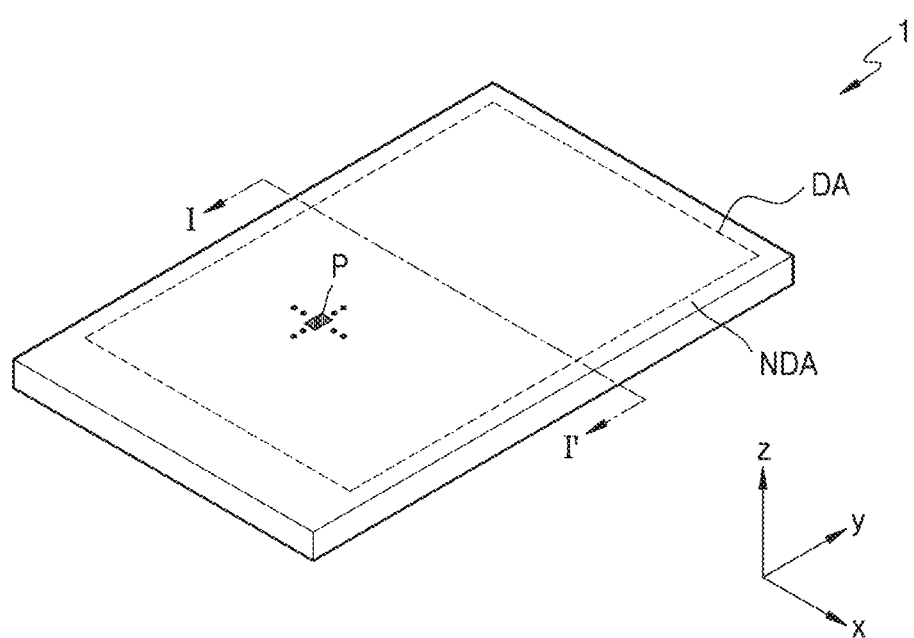
FIGS. 1 and 2 are schematic perspective views of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. The expression "at least one of A and B" indicates only A, only B, both A and B, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Sizes of elements in the drawings may be exaggerated for convenience of explanation. For example, since sizes and thicknesses of components in the drawings are arbitrarily illustrated for convenience of explanation, the embodiments described herein are not limited thereto.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In the following embodiments, the meaning that a wire extends in a first direction or a second direction encompasses not only extending in a straight line but also extending in zigzags or in a curve in the first direction or the second direction.

In the following embodiments, when referred to "planar", it means when an object is viewed from above, and when referred to "sectional", it means when a cross section formed by vertically cutting an object is viewed from the side. In the following embodiments, when referred to "overlapping", it encompasses "planar" overlapping and "cross-sectional" overlapping.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
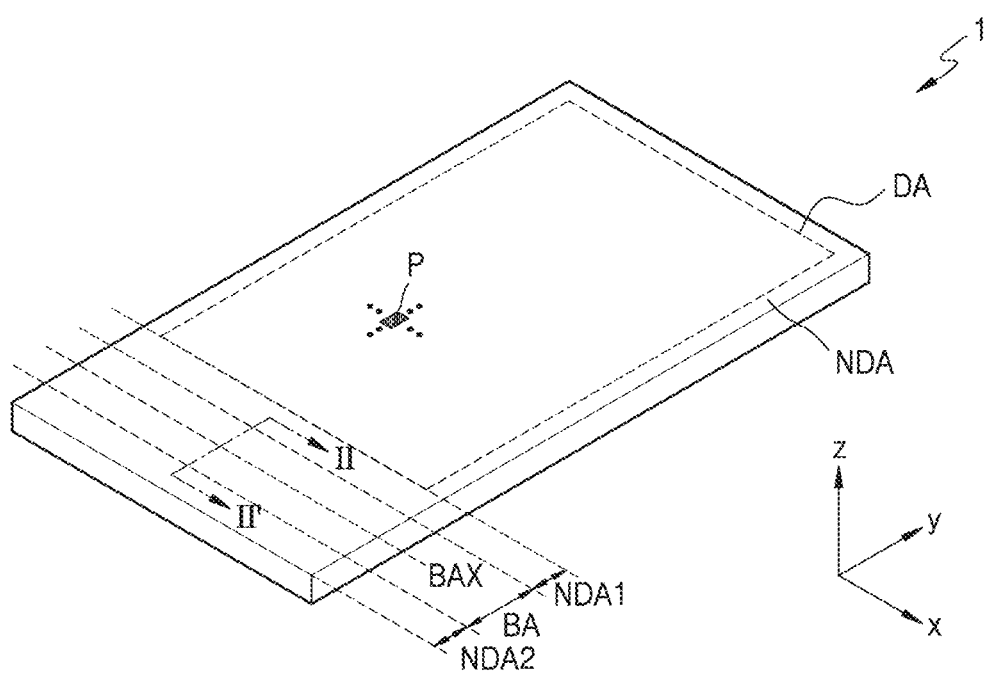

FIGS. 1 and 2 are schematic perspective views of a display apparatus according to an embodiment.

Referring to FIG. 1, an embodiment of a display apparatus 1 may include a display area DA and a non-display area NDA around the display area DA. The non-display area NDA may surround the display area DA. The display apparatus 1 may provide an image by using light emitted by a plurality of pixels P arranged in the display area DA. In the non-display area NDA, no images may be displayed.

Hereinafter, for convenience of description, embodiments where the display apparatus 1 is an organic light-emitting display will described in detail, but the display apparatus 1 is not limited thereto. According to an embodiment, the display apparatus 1 may be an inorganic light-emitting display, a quantum dot light-emitting display, or the like. In one embodiment, for example, an emission layer of a display element included in the display apparatus 1 may include an organic material, include an inorganic material, include quantum dots, include an organic material and quantum dots, or include an inorganic material and quantum dots.

Although FIG. 1 illustrates an embodiment where a display apparatus 1 includes a flat display surface, embodiments of the disclosure are not limited thereto. According to an alternative embodiment, the display apparatus 1 may include a three-dimensional display surface or a curved display surface.

In an embodiment, where the display apparatus 1 includes a three-dimensional display surface, the display apparatus 1 may include a plurality of display areas pointing different directions, and, for example, may include a display surface in the form of a polyprism. According to an alternative embodiment, where the display apparatus 1 includes a curved display surface, the display apparatus 1 may be implemented in various shapes including flexible, foldable, and rollable display apparatuses.

FIG. 1 illustrates an embodiment where the display apparatus 1 is applied to mobile phones. In such an embodiment, although now shown, electronic modules, a camera module, a power supply module, and the like mounted on a main board may be arranged in a bracket/case or the like together with the display apparatus 1, thereby constituting a mobile phone. The display apparatus 1 is applicable to not only large-sized electronic apparatuses, such as televisions and monitors, but also small- and medium-sized electronic apparatuses, such as tablets, automobile navigation devices, game players, smart watches, etc.

In an embodiment, as shown in FIG. 1, the display area DA of the display apparatus 1 is rectangular, but not being limited thereto. Alternatively, the shape of the display area DA may be a circle, an oval, or a polygon such as a triangle or a pentagon.

Referring to FIG. 2, the non-display area NDA may include not only a portion of the non-display area NDA that surrounds the display area DA, but also may include a first non-display area NDA1, a second non-display area NDA2, and a bending area BA. As shown in FIG. 2, the bending area BA may be bent about a bending axis BAX extending in an x direction. Herein, as shown in FIGS. 1 and 2, the x direction may be a width direction of the display apparatus 1, a y direction may be a length direction of the display apparatus 1 and a z direction may be a thickness direction of the display apparatus 1.

The first non-display area NDA1 and the second non-display area NDA2 may be defined on the basis of the bending area BA. The first non-display area NDA1 may be adjacent to the display area DA. The second non-display area NDA2 is not visible from the front when the bending area BA is bent, and includes a data driving circuit 150 of FIG. 5.

Similarly to the non-display area NDA, the first non-display area NDA1 may be an area where no images are displayed in an electronic device such as an actual display apparatus or a smartphone including a display.

Figure 3:
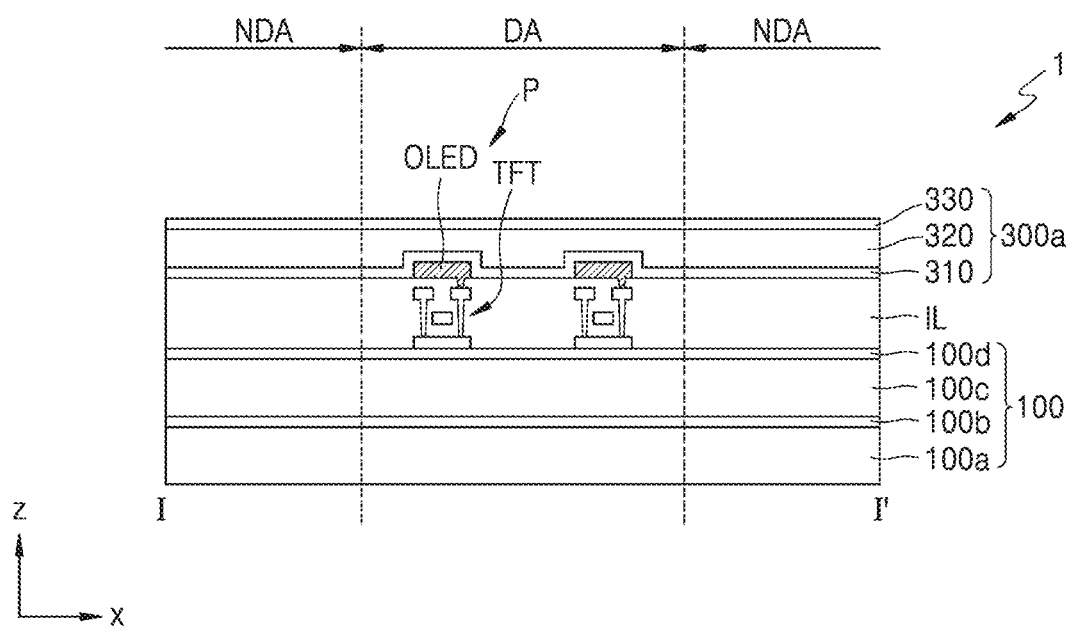
FIGS. 3 and 4 are schematic cross-sectional views of a display apparatus according to an embodiment.
Figure 4:
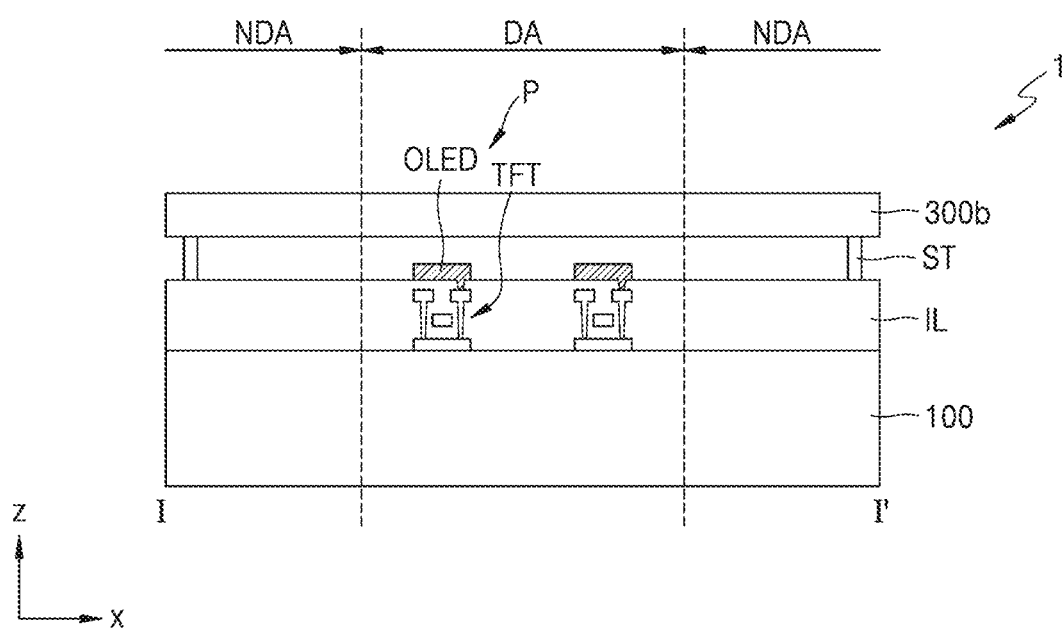

FIGS. 3 and 4 are schematic cross-sectional views of a display apparatus according to an embodiment.

Referring to FIG. 3, an embodiment of the display apparatus 1 may include a substrate 100, an insulating layer IL arranged on the substrate 100, a display element arranged on the insulating layer IL, and a thin-film encapsulation layer 300a covering the display element. In one embodiment, for example, the display element may be an organic light-emitting diode OLED.

In an embodiment, the substrate 100 may include a polymer resin. In such an embodiment, the polymer resin may include at least one selected from polyethersulphone, polyacrylate, polyetherimide, polyethylene naphthalate, polyethylene terephthalate, polyphenylene sulfide, polyarylate, polyimide, polycarbonate, and cellulose acetate propionate, for example. The substrate 100 including the polymer resin may have flexible, rollable, or bendable characteristics. The substrate 100 may have a multi-layered structure including a layer including the aforementioned polymer resin and an inorganic layer (not shown).

According to an embodiment, the substrate 100 may include a first substrate 100a, a first barrier layer 100b on the first substrate 100a, a second substrate 100c on the first barrier layer 100b, and a second barrier layer 100d on the second substrate 100c. In one embodiment, for example, the first substrate 100a and the second substrate 100c may include polyimide.

In an embodiment of the display apparatus 1, a display element layer may be on the substrate 100. The display element layer may include a pixel circuit including thin-film transistors TFT, organic light-emitting diodes OLED being display elements, and an insulating layer IL therebetween. In an embodiment of the display apparatus 1, a pixel P including a thin-film transistor TFT and an organic light-emitting diode OLED connected to the thin-film transistor TFT may be arranged in the display area DA.

In an embodiment of the display apparatus 1, the organic light-emitting diode OLED may be covered by a thin-film encapsulation layer 300a. The thin-film encapsulation layer 300a may include an inorganic encapsulation layer and an organic encapsulation layer. In an embodiment, as shown in FIG. 3, the inorganic encapsulation layer and the organic encapsulation layer of the thin-film encapsulation layer 300a may include first and second inorganic encapsulation layers 310 and 330 and an organic encapsulation layer 320 therebetween.

The first and second inorganic encapsulation layers 310 and 330 may include at least one inorganic insulating material, such as aluminum oxide, titanium oxide, tantalum oxide, hafnium oxide, zinc oxide, silicon oxide, silicon nitride, silicon oxynitride, and/or the like. The organic encapsulation layer 320 may include a polymer-based material. Examples of the polymer-based material may include an acrylic resin, an epoxy-based resin, polyimide, and polyethylene.

Referring to FIG. 4, in an embodiment of the display apparatus 1, the substrate 100 may include a glass material mainly containing $SiO_2$, and an encapsulation substrate 300b may be arranged on the substrate 100 to face the substrate 100. The encapsulation substrate 300b may include a glass material mainly containing $SiO_2$.

In an embodiment of the display apparatus 1, the encapsulation substrate 300b may be arranged to face the substrate 100, and a sealant ST may be between the substrate 100 and the encapsulation substrate 300b. The sealant ST may be located on the edge of the substrate 100 and may entirely surround the display element layer between the substrate 100 and the encapsulation substrate 300b. When viewed from a direction perpendicular to the upper surface of the substrate 100 (or the z direction), the display area DA may be entirely surrounded by the sealant ST.

Figure 5:
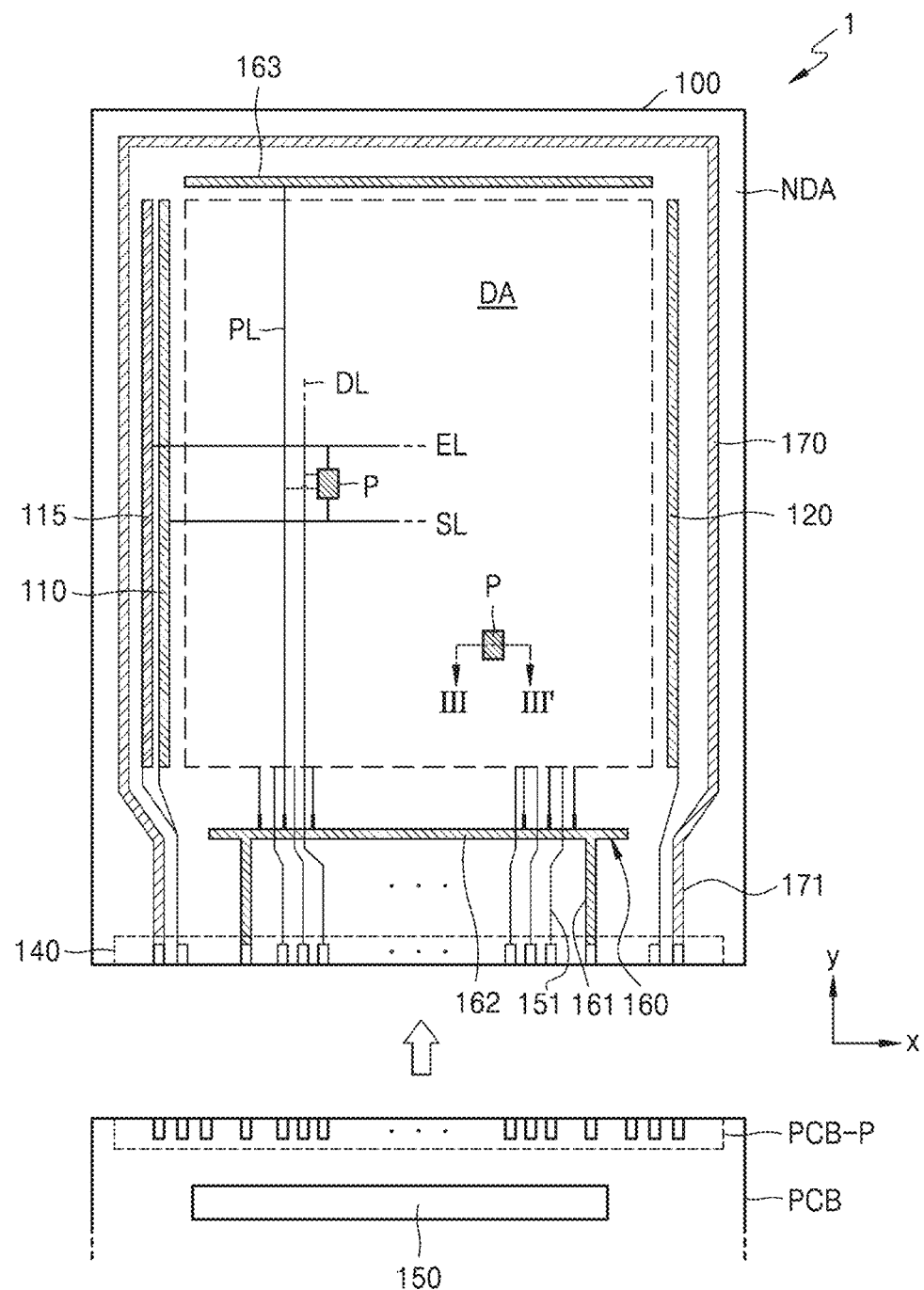
FIG. 5 is a schematic plan view of a display apparatus according to an embodiment.

FIG. 5 is a schematic plan view of a display apparatus according to an embodiment.

Referring to FIG. 5, an embodiment of the display apparatus 1 may include a plurality of pixels P arranged in the display area DA. Each of the plurality of pixels P may include a display element, such as an organic light-emitting diode OLED. Each of the plurality of pixels P may emit, for example, red light, green light, blue light, or white light, via the organic light-emitting diode OLED. The pixel P used herein may be understood as a pixel that emits one of red light, green light, blue light, and white light as described above.

Each of the plurality of pixels P may be electrically connected to outer circuits arranged in the non-display area NDA. In an embodiment, each of the plurality of pixels P may be electrically connected to a first scan driving circuit 110, a first light-emission driving circuit 115, a second scan driving circuit 120, a terminal 140, a data driving circuit 150, a first power supply line 160, and a second power supply line 170 arranged in the non-display area NDA.

The first scan driving circuit 110 may provide a scan signal to each of the plurality of pixels P via a scan line SL. The first light-emission driving circuit 115 may provide a light-emission control signal to each of the plurality of pixels P via a light-emission control line EL. The second scan driving circuit 120 may be arranged opposite to the first scan driving circuit 110 with the display area DA therebetween. Some of the plurality of pixels P arranged in the display area DA may be electrically connected to the first scan driving circuit 110, and the remaining ones of the pixels P may be electrically connected to the second scan driving circuit 120. According to an embodiment, a second light-emission driving circuit (not shown) may be arranged opposite to the first light-emission driving circuit 115 with the display area DA therebetween.

The first light-emission driving circuit 115 may be arranged on the non-display area NDA to be spaced apart from the first scan driving circuit 110 in the x direction. According to an embodiment, the first light-emission driving circuit 115 may be disposed next to and spaced apart from the first scan driving circuit 110 in the y direction at a same side on the non-display area NDA.

The terminal 140 may be on one side of the substrate 100. The terminal 140 may be exposed without being covered by an insulating layer, and may be electrically connected to a printed circuit board PCB. A terminal PCB-P of the printed circuit board PCB may be electrically connected to the terminal 140 of the display apparatus 1. The printed circuit board PCB transmits a signal or power of a controller (not shown) to the display apparatus 1. A control signal generated by the controller may be transmitted to each of the first scan driving circuit 110, the first light-emission driving circuit 115, and the second scan driving circuit 120 via the printed circuit board PCB. The controller may provide a first power supply voltage ELVDD and a second power supply voltage ELVSS to the first and second power supply lines 160 and 170 via first and second connection lines 161 and 171, respectively. The first power supply voltage ELVDD may be provided to each of the plurality of pixels P via a driving voltage line PL connected to the first power supply line 160, and the second power supply voltage ELVSS may be provided to an opposite electrode of each of the plurality of pixels P connected to the second power supply line 170.

The data driving circuit 150 is electrically connected to a data line DL. A data signal of the data driving circuit 150 may be provided to each of the plurality of pixels P via a connection line 151 connected to the terminal 140 and the data line DL connected to the connection line 151.

FIG. 5 illustrates arrangement of the data driving circuit 150 on the printed circuit board PCB in an embodiment. However, according to an alternative embodiment, the data driving circuit 150 may be arranged on the substrate 100. In one embodiment, for example, the data driving circuit 150 may be between the terminal 140 and the first power supply line 160. The data driving circuit 150 may be bent about the bending axis BAX of FIG. 2, and may be arranged on the rear surface of the display apparatus 1 not to be visually recognized at the front when being bent.

The first power supply line 160 may include a first sub-wire 162 and a second sub-wire 163, each extending in the x direction and being parallel to each other and spaced apart from each other with the display area DA therebetween. The second power supply line 170 may partially surround the display area DA by having a loop shape with an open side.

Figure 6:
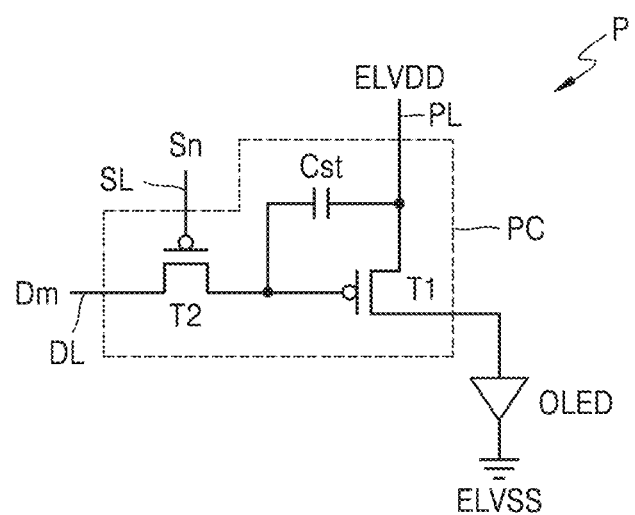
FIGS. 6 and 7 are equivalent circuit diagrams of a pixel of a display apparatus according to an embodiment.
Figure 7:
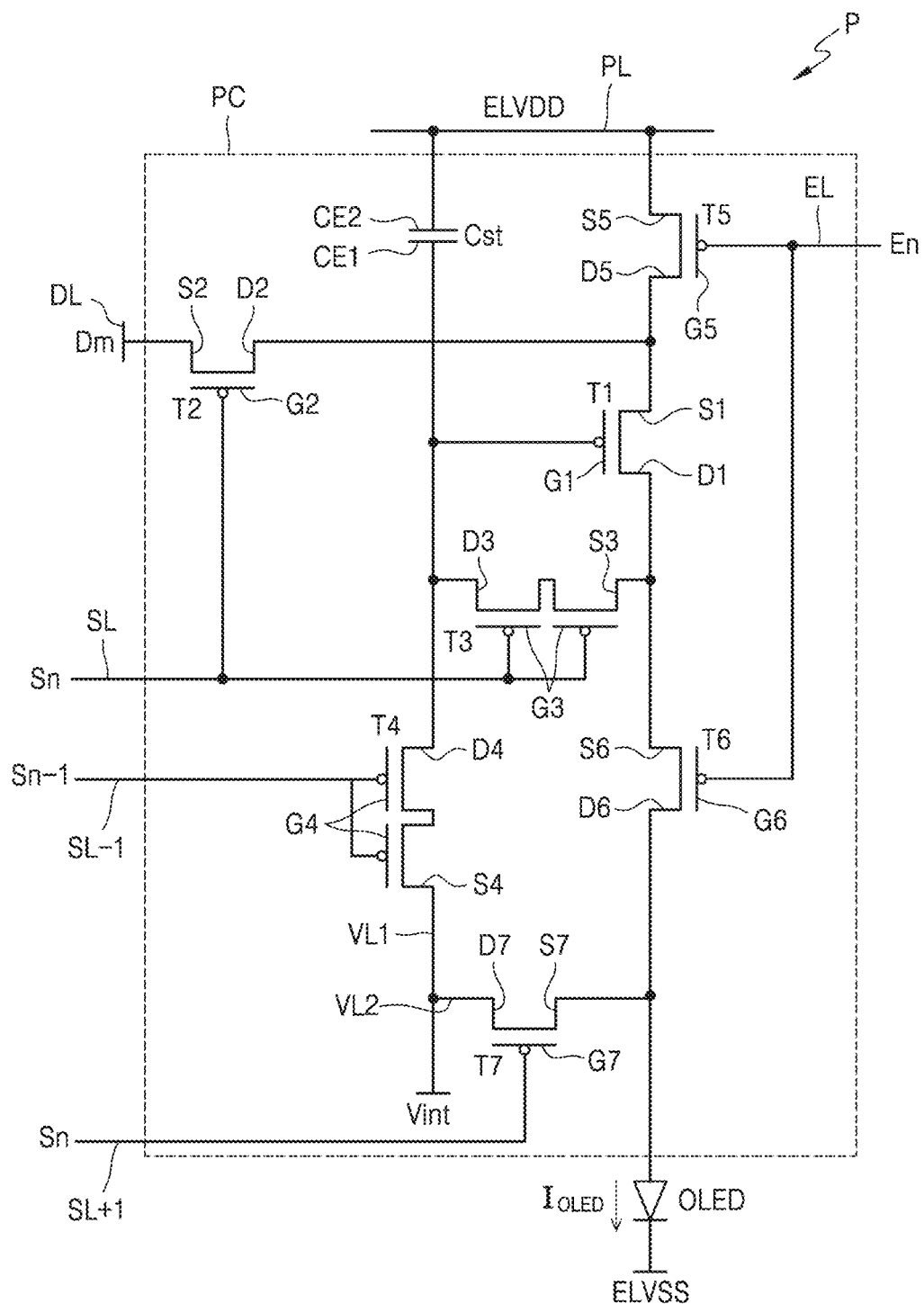

FIGS. 6 and 7 are equivalent circuit diagrams of a pixel of a display apparatus according to an embodiment.

Referring to FIG. 6, in an embodiment, a pixel P includes a pixel circuit PC connected to a scan line SL and a data line DL, and an organic light-emitting diode OLED connected to the pixel circuit PC. In such an embodiment, each pixel of the display apparatus may have a substantially same structure as each other.

The pixel circuit PC includes a driving thin-film transistor T1, a switching thin-film transistor T2, and a storage capacitor Cst. The switching thin-film transistor T2 is connected to the scan line SL and the data line DL, and transmits, to the driving thin-film transistor T1, a data signal Dm received via the data line DL in response to a scan signal Sn received via the scan line SL.

The storage capacitor Cst is connected to the switching thin-film transistor T2 and a driving voltage line PL, and stores a voltage corresponding to a difference between a voltage received from the switching thin-film transistor T2 and the first power supply voltage ELVDD (or referred to as a driving voltage) supplied to the driving voltage line PL.

The driving thin-film transistor T1 may be connected to the driving voltage line PL and the storage capacitor Cst, and may control a driving current flowing from the driving voltage line PL to the organic light-emitting diode OLED, based on a voltage value stored in the storage capacitor Cst. The organic light-emitting diode OLED may emit light having a brightness corresponding to the driving current.

Although an embodiment where the pixel circuit PC includes two thin-film transistors and a single storage capacitor is illustrated in FIG. 6, the disclosure is not limited thereto. Alternatively, as shown in FIG. 7, the pixel circuit PC may include seven thin-film transistors and a single storage capacitor.

Referring to FIG. 7, in an alternative embodiment, a pixel P includes a pixel circuit PC and an organic light-emitting diode OLED electrically connected to the pixel circuit PC. The pixel circuit PC may include a plurality of thin-film transistors T1 through T7, namely, a driving thin-film transistor T1, a switching thin-film transistor T2, a compensating thin-film transistor T3, a first initializing thin-film transistor T4, an operation control thin-film transistor T5, a light-emission control thin-film transistor T6, and a second initializing thin-film transistor T7, and a storage capacitor Cst. The plurality of thin-film transistors T1 through T7 and the storage capacitor Cst may be connected to signal lines SL, SL−1, SL+1, EL, and DL, a first initializing voltage line VL1, a second initializing voltage line VL2, and the driving voltage line PL.

The signal lines SL, SL−1, SL+1, EL, and DL may include a scan line SL that transmits a scan signal Sn, a previous scan line SL−1 that transmits a previous scan signal Sn−1 to the first initializing thin-film transistor T4, a next scan line SL+1 that transmits a scan signal Sn to the second initializing thin-film transistor T7, a light-emission control line EL that transmits a light-emission control signal En to the operation control thin-film transistor T5 and the light-emission control thin-film transistor T6, and a data line DL that intersects with the scan line SL and transmits a data signal Dm. The driving voltage line PL may transmit a driving voltage ELVDD to the driving thin-film transistor T1, the first initializing voltage line VL1 may transmit an initializing voltage Vint to the first initializing thin-film transistor T4, and the second initializing voltage line VL2 may transmit the initializing voltage Vint to the second initializing thin-film transistor T7.

The driving thin-film transistor T1 includes a driving gate electrode G1 connected to a lower electrode CE1 of the storage capacitor Cst, a driving source electrode S1 connected to the driving voltage line PL via the operation control thin-film transistor T5, and a driving drain electrode D1 electrically connected to the pixel electrode of the organic light-emitting diode OLED via the light-emission control thin-film transistor T6. The driving thin-film transistor T1 receives the data signal Dm according to a switching operation of the switching thin-film transistor T2 and supplies a driving current $I_{OLED}$ to the organic light-emitting diode OLED.

The switching thin-film transistor T2 includes a switching gate electrode G2 connected to the scan line SL, a switching source electrode S2 connected to the data line DL, and a switching drain electrode D2 connected to the driving source electrode S1 of the driving TFT T1 and also connected to the driving voltage line PL via the operation control TFT T5. The switching thin-film transistor T2 is turned on in response to the scan signal Sn received via the scan line SL and performs a switching operation of transmitting the data signal Dm received from the data line DL to the driving source electrode S1 of the driving thin-film transistor T1.

The compensating thin-film transistor T3 includes a compensating gate electrode G3 connected to the scan line SL, a compensating source electrode S3 connected to the driving drain electrode D1 of the driving thin-film transistor T1 and also connected to the pixel electrode of the organic light-emitting diode OLED via the light-emission control thin-film transistor T6, and a compensating drain electrode D3 connected to the lower electrode CE1 of the storage capacitor Cst, a first initializing drain electrode D4 of the first initializing thin-film transistor T4, and the driving gate electrode G1 of the driving thin-film transistor T1. The compensating thin-film transistor T3 is turned on in response to the scan signal Sn received via the scan line SL and electrically connects the driving gate electrode G1 and the driving drain electrode D1 of the driving thin-film transistor T1 to each other, such that the driving thin-film transistor T1 is diode-connected.

The first initializing thin-film transistor T4 includes a first initializing gate electrode G4 connected to the previous scan line SL−1, a first initializing source electrode S4 connected to the first initializing voltage line VL1, and the first initializing drain electrode D4 connected to the lower electrode CE1 of the storage capacitor Cst, the compensating drain electrode D3 of the compensating thin-film transistor T3, and the driving gate electrode G1 of the driving thin-film transistor T1. The first initializing thin-film transistor T4 is turned on in response to the previous scan signal Sn−1 received via the previous scan line SL−1 and transmits the initializing voltage Vint to the driving gate electrode G1 of the driving thin-film transistor T1 to thereby initialize a voltage of the driving gate electrode G1 of the driving thin-film transistor T1.

The operation control thin-film transistor T5 includes an operation control gate electrode G5 connected to the light-emission control line EL, an operation control source electrode S5 connected to the driving voltage line PL, and an operation control drain electrode D5 connected to the driving source electrode S1 of the driving thin-film transistor T1 and the switching drain electrode D2 of the switching thin-film transistor T2.

The light-emission control thin-film transistor T6 includes a light-emission control gate electrode G6 connected to the light-emission control line EL, a light-emission control source electrode S6 connected to the driving drain electrode D1 of the driving thin-film transistor T1 and the compensating source electrode S3 of the compensating thin-film transistor T3, and a light-emission control drain electrode D6 electrically connected to a second initializing source electrode S7 of the second initializing thin-film transistor T7 and the pixel electrode of the organic light-emitting diode OLED.

The operation control thin-film transistor T5 and the light-emission control thin-film transistor T6 are simultaneously turned on in response to the light-emission control signal En received via the light-emission control line EL, and thus the driving voltage ELVDD is transmitted to the organic light-emitting diode OLED such that the driving current IOLED may flow in the organic light-emitting diode OLED.

The second initializing thin-film transistor T7 includes a second initializing gate electrode G7 connected to the next scan line SL+1, the second initializing source electrode S7 connected to the light-emission control drain electrode D6 of the light-emission control thin-film transistor T6 and the pixel electrode of the organic light-emitting diode OLED, and the second initializing drain electrode D7 connected to the second initializing voltage line VL2.

The scan line SL and the next scan line SL+1 may be electrically connected to each other such that the same scan signal Sn may be applied to the scan line SL and the next scan line SL+1. Accordingly, the second initializing thin-film transistor T7 may be turned on in response to the scan signal Sn received via the next scan line SL+1 and may initialize the pixel electrode of the organic light-emitting diode OLED.

An upper electrode CE2 of the storage capacitor Cst is connected to the driving voltage line PL, and a common electrode of the organic light-emitting diode OLED is connected to a common voltage ELVSS. Accordingly, the organic light-emitting diode OLED may receive the driving current $I_{OLED}$ from the driving thin-film transistor T1 and emits light, thereby displaying an image.

In an embodiment, as shown in FIG. 7, each of the compensating thin-film transistor T3 and the first initializing thin-film transistor T4 has a dual gate electrode in FIG. 7, but not being limited thereto. Alternatively, each of the compensating thin-film transistor T3 and the first initializing thin-film transistor T4 may have a single gate electrode.

Figure 8:
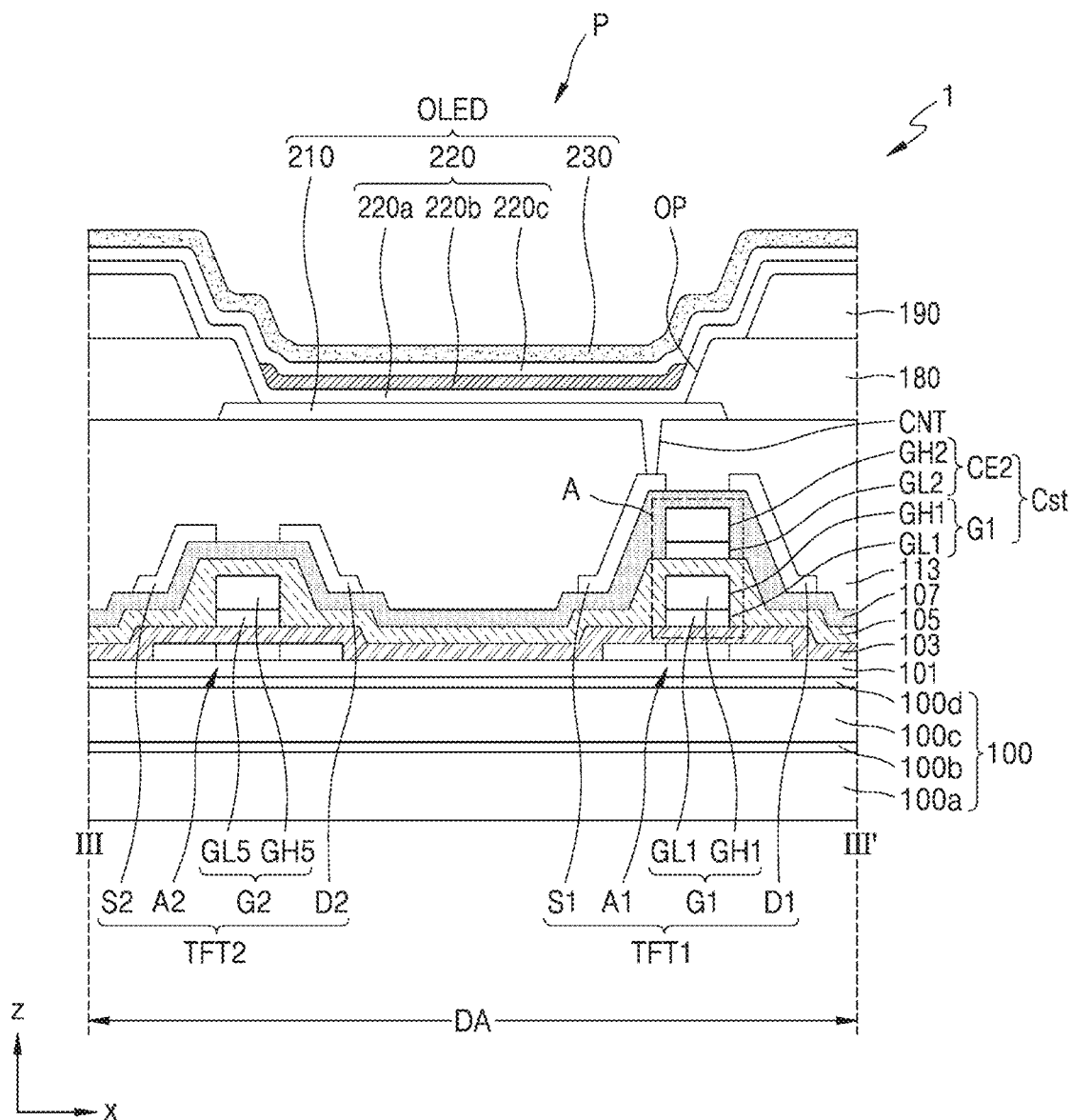
FIG. 8 is a schematic cross-sectional view of a display apparatus according to an embodiment.
Figure 9:
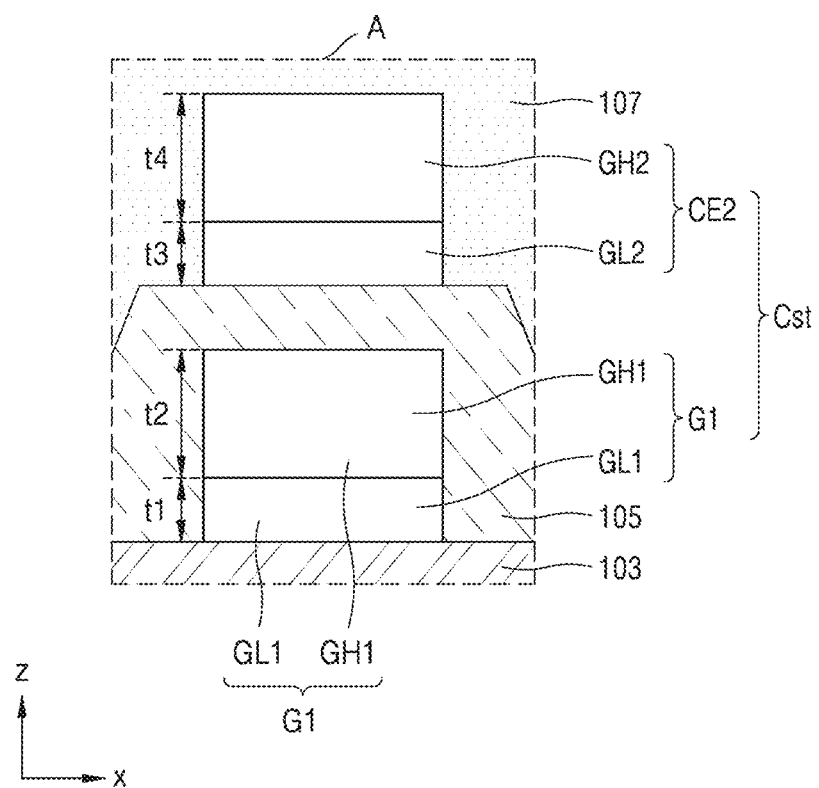
FIG. 9 is a schematic cross-sectional view of a display apparatus according to an embodiment.

FIG. 8 is a schematic cross-sectional view of a display apparatus according to an embodiment of the disclosure, and FIG. 9 is a schematic cross-sectional view of a display apparatus according to an embodiment of the disclosure. In detail, FIG. 8 corresponds to a cross-section of the display apparatus 1 taken along line III-Ill' of FIG. 5, and FIG. 9 is an enlarged view of a portion A of the display apparatus 1 of FIG. 8.

Referring to FIG. 8, an embodiment of the display apparatus 1 includes the substrate 100, thin-film transistors TFT on the substrate 100, a storage capacitor Cst, and an organic light-emitting diode OLED as a display element. In one embodiment, for example, the thin-film transistors TFT may correspond to the driving thin-film transistor T1 and the switching thin-film transistor T2 of FIG. 7.

The substrate 100 may include a polymer resin. In an embodiment, where the substrate 100 includes the polymer resin, the substrate 100 may have flexible, rollable, or bendable characteristics. According to an embodiment, the substrate 100 may include the first substrate 100a, the first barrier layer 100b on the first substrate 100a, the second substrate 100c on the first barrier layer 100b, and the second barrier layer 100d on the second substrate 100c. In one embodiment, for example, the first substrate 100a and the second substrate 100c may include polyimide.

In an embodiment of the display apparatus 1, a buffer layer 101 may be on the substrate 100 of the display area DA. The buffer layer 101 may be positioned on the substrate 100 and may reduce or prevent infiltration of a foreign material, moisture, or ambient air from below the substrate 100 and may provide a flat surface on the substrate 100. The buffer layer 101 may include an inorganic material (such as oxide or nitride), an organic material, or an organic and inorganic compound, and may have a single layer structure or a multi-layer structure of an inorganic material and an organic material.

In an embodiment of the display apparatus 1, a first thin-film transistor TFT1 and a second thin-film transistor TFT2 may be on the buffer layer 101. The first thin-film transistor TFT1 may include a first semiconductor layer A1, a first gate electrode G1, and a first source electrode S1 and a first drain electrode D1 as connecting electrodes, and the second thin-film transistor TFT2 may include a second semiconductor layer A2, a second gate electrode G2, and a second source electrode S2 and a second drain electrode D2 as connecting electrodes.

The first thin-film transistor TFT1 may be electrically connected to the organic light-emitting diode OLED, which is the display element, and may drive the organic light-emitting diode OLED.

The first semiconductor layer A1 may be on the buffer layer 101, and may include a channel region overlapping the first gate electrode G1, and a source region and a drain region arranged on opposing sides of the channel region, respectively, and each of the source region and the drain region thereof may have a higher concentration of impurities than the channel region thereof. The impurities may include N-type impurities or P-type impurities. Although not shown in FIG. 8, the source region and the drain region may be electrically connected to the connecting electrodes.

The first semiconductor layer A1 may include an oxide semiconductor and/or a silicon semiconductor. The first semiconductor layer A1 may include oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). In one embodiment, for example, the first semiconductor layer A1 may include InSnZnO ("ITZO"), InGaZnO ("IGZO"), or the like. In an embodiment where the first semiconductor layer A1 includes or is formed of a silicon semiconductor, the first semiconductor layer A1 may include, for example, amorphous silicon ("a-Si") or low temperature poly-silicon ("LTPS") obtained by crystallizing a-Si.

The second semiconductor layer A2 may be on the buffer layer 101, and may include a channel region overlapping the second gate electrode G2, and a source region and a drain region arranged on opposing sides of the channel region, respectively, and each of the source region and the drain region thereof may have a higher concentration of impurities than the channel region thereof. The impurities may include N-type impurities or P-type impurities. Although not shown in FIG. 8, the source region and the drain region may be electrically connected to the connecting electrodes. The second semiconductor layer A2 may include a same material as that included in the first semiconductor layer A1.

In an embodiment of the display apparatus 1, a first insulating layer 103 may be on the first and second semiconductor layers A1 and A2. The first insulating layer 103 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may have a single layer structure or a multi-layer structure including the aforementioned inorganic insulating material.

Figure 10:
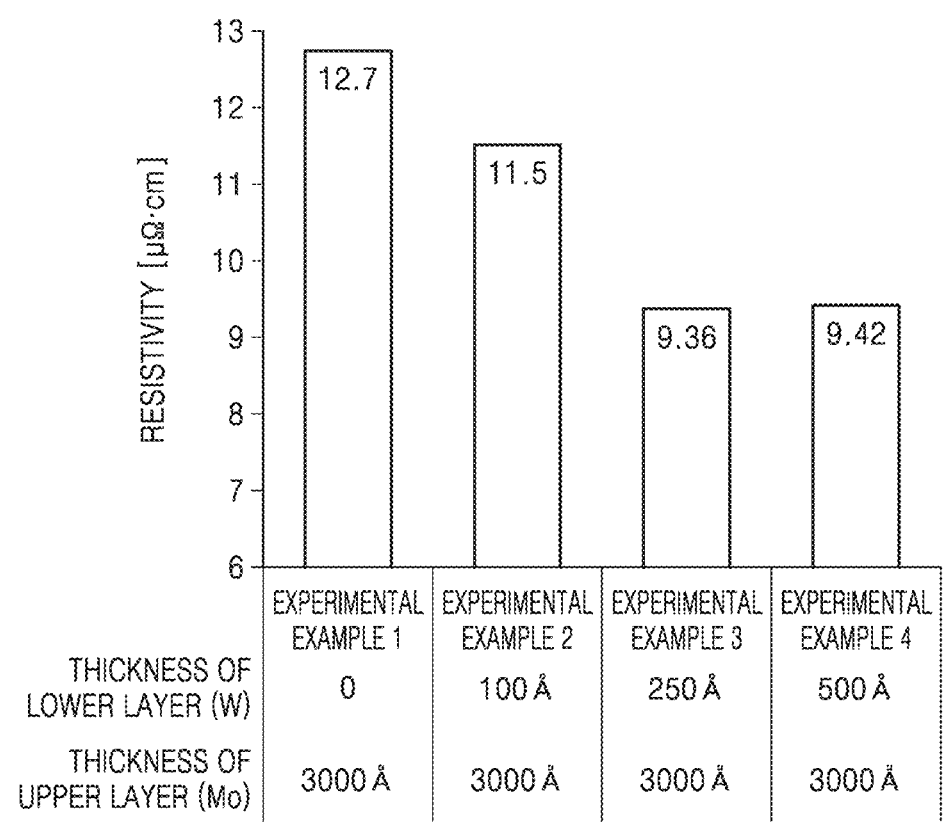
FIG. 10 is a graph of resistivity of an upper layer according to a thickness of a lower layer, in a thin film in which the lower layer and the upper layer are stacked.

FIG. 10 is a graph of resistivity of an upper layer according to a thickness of a lower layer, in a thin film in which the lower layer and the upper layer are stacked.

In detail, FIG. 10 is a graph showing, in a thin film including a lower layer including tungsten (W) and an upper layer including molybdenum (Mo), resistivity of the upper layer including molybdenum (Mo) when the lower layer including tungsten (W) is not included (Experimental example 1), when the lower layer including tungsten (W) is 100 angstrom (Å) (Experimental example 2), when the lower layer including tungsten (W) is 250 Å (Experimental example 3), and when the lower layer including tungsten (W) is 500 Å (Experimental example 4). In Experimental examples 1 through 4, respective upper layers, each including molybdenum (Mo), were each stacked with a thickness of 3000 Å.

Referring to FIG. 10, when the lower layer including tungsten (W) is not included (Experimental example 1), the resistivity of the upper layer including molybdenum (Mo) is 12.7 microhm centimeter (μΩ·cm), when the lower layer including tungsten (W) is 100 Å (Experimental example 2), the resistivity of the upper layer including molybdenum (Mo) is 11.5 μΩ·cm, and when the lower layer including tungsten (W) is 250 Å (Experimental example 3), the resistivity of the upper layer including molybdenum (Mo) is 9.36 μΩ·cm. As the thickness of the lower layer including tungsten (W) increases, the resistivity of the upper layer decreased. Accordingly, in a case where the thickness of the upper layer is constant, the resistance of the upper layer including molybdenum (Mo) may decrease as the thickness of the lower layer including tungsten (W) increases.

When the lower layer including tungsten (W) is 500 Å (Experimental example 4), the resistivity of the upper layer including molybdenum (Mo) is 9.42 μ·Ωcm. The resistivity when the lower layer including tungsten (W) is 500 Å (Experimental example 4) has a similar value to the value of the resistivity when the lower layer including tungsten (W) is 250 Å (Experimental example 3).

Accordingly, when the upper layer including molybdenum (Mo) having a thickness of 3000 Å is stacked with the lower layer including tungsten (W), and the thickness of the lower layer including tungsten (W) is 250 Å or greater, the resistance of the upper layer may decrease.

Experimental examples 1 through 4 of FIG. 10 show resistivity values of the upper layer including molybdenum (Mo) when the upper layer including molybdenum (Mo) was stacked with a thickness of 3000 Å on the lower layer. However, even when the thickness of the upper layer including molybdenum (Mo) stacked on the lower layer changes, the resistivity of the upper layer including molybdenum (Mo) has the same tendency as that in Experimental examples 1 through 4.

Figure 11:
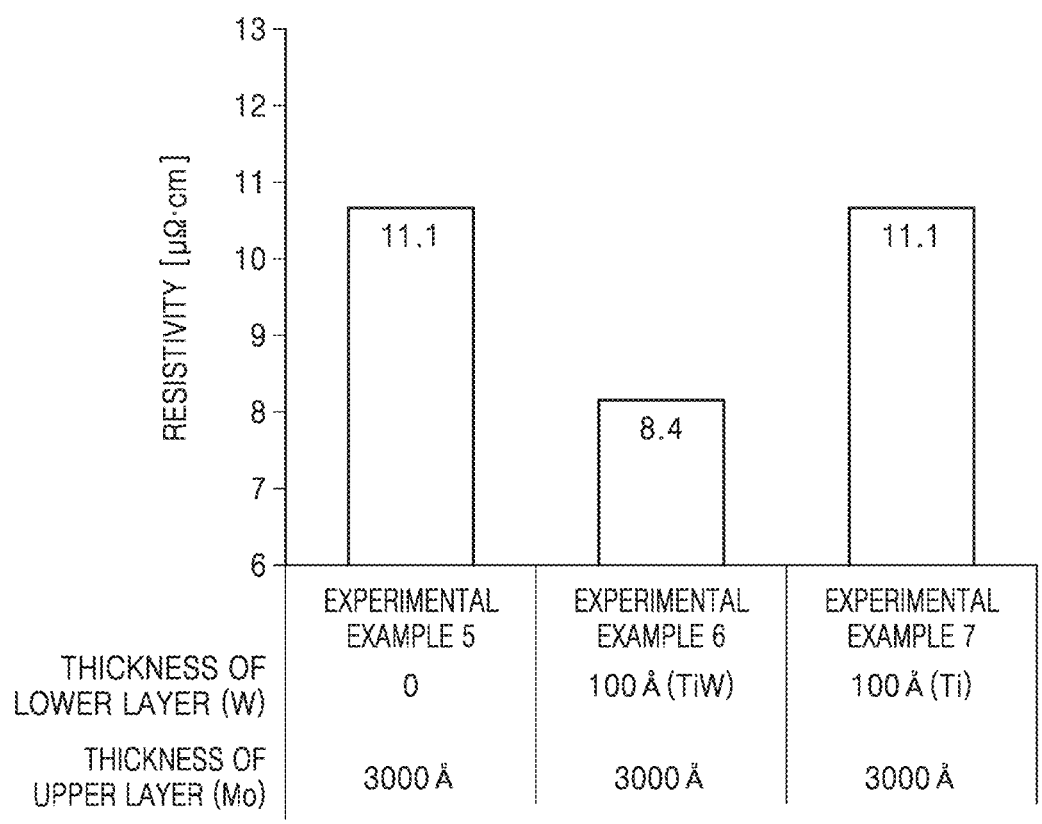
FIG. 11 is a graph of resistivity of an upper layer according to the existence or absence of a lower layer or a material included in the lower layer, in a thin film in which the lower layer and the upper layer are stacked.

FIG. 11 is a graph of resistivity of an upper layer according to the existence or absence of a lower layer or a material included in the lower layer, in a thin film in which the lower layer and the upper layer are stacked.

In detail, FIG. 11 is a graph showing, in a thin film including a lower layer and an upper layer including molybdenum (Mo), resistivity of the upper layer including molybdenum (Mo) when the lower layer is not included (Experimental example 5), when a lower layer including a titanium-tungsten alloy (TiW) is 100 Å (Experimental example 6), and when a lower layer including titanium (Ti) is 100 Å (Experimental example 7). In Experimental examples 5 through 7, respective upper layers each including molybdenum (Mo) were each stacked with a thickness of 3000 Å, and the titanium-tungsten alloy (TiW) had a composition of 90 wt % tungsten (W), and 10 wt % titanium (Ti).

Referring to FIG. 11, when the lower layer is not included (Experimental example 5), the resistivity of the upper layer including molybdenum (Mo) is 11.1 μΩ·cm, when the lower layer including a titanium-tungsten alloy (TiW) is 100 Å (Experimental example 6), and the resistivity of the upper layer including molybdenum (Mo) is 8.4 μΩ·cm. When the lower layer including a titanium-tungsten alloy (TiW) is included, the resistance of the upper layer including molybdenum (Mo) may decrease.

However, because the resistivity of the upper layer including molybdenum (Mo) is 11.1 μΩ·cm when the lower layer including titanium (Ti) is 100 Å (Experimental example 7), when the lower layer includes only titanium (Ti), the resistance of the upper layer including molybdenum (Mo) did not decrease. Experimental examples 5 through 7 of FIG. 11 show resistivity values of the upper layer including molybdenum (Mo) when the upper layer including molybdenum (Mo) was stacked with a thickness of 3000 Å on the lower layer. However, even when the thickness of the upper layer including molybdenum (Mo) stacked on the lower layer changes, the resistivity of the upper layer including molybdenum (Mo) has the same tendency as that in Experimental examples 5 through 7.

Experimental examples 5 through 7 of FIG. 11 show resistivity values of the upper layer including molybdenum (Mo) when the lower layer including a titanium-tungsten alloy (TiW) is 100 Å (Experimental example 6) and when the lower layer including titanium (Ti) is 100 Å (Experimental example 7). However, even when the thickness of the lower layer including a titanium-tungsten alloy (TiW) or titanium (Ti) stacked on the upper layer including molybdenum (Mo) changes, the resistivity of the upper layer including molybdenum (Mo) has the same tendency as that in Experimental examples 5 through 7.

Referring back to FIG. 8, in an embodiment of the display apparatus 1, the first gate electrode G1 may be on the first insulating layer 103. The first gate electrode G1 may include at least one metal selected from molybdenum (Mo), titanium (Ti) and tungsten (W), and may have a single layer structure or a multi-layer structure. The first gate electrode G1 may be connected a gate line that applies an electrical signal to the first gate electrode G1.

In an embodiment where a gate electrode includes or is formed of molybdenum (Mo), and molybdenum (Mo) is formed to have a thickness of about 2700 Å or greater to reduce the resistance of the gate electrode, a substrate may be bent due to the tensile stress of a molybdenum (Mo) thin film. In a case where aluminum (Al), copper (Cu), and silver (Ag) instead of molybdenum (Mo) are used to form the gate electrode, a dry etching process may be impossible (e.g., when using Cu and Ag), or a Hillock phenomenon, in which a big or small protrusion is formed on the surface of a thin film, may occur (e.g., when using Al).

The first gate electrode G1 of the display apparatus 1 may include a first lower layer GL1 and a first upper layer GH1 arranged on the first lower layer GL1 and including a different material from the first lower layer GL1. According to an embodiment, the first lower layer GL1 of the first gate electrode G1 of the display apparatus 1 may include tungsten (W). According to an alternative embodiment, the first lower layer GL1 of the first gate electrode G1 may include a tungsten (W) alloy including tungsten (W) and a first element. A content (or amount) of the first element of the tungsten (W) alloy may be less than 50 wt %, and the first element may be selected from titanium (Ti), zirconium (Zr) and hafnium (Hf). In one embodiment, for example, the first lower layer GL1 of the first gate electrode G1 may include a titanium-tungsten alloy (TiW).

The first upper layer GH1 of the first gate electrode G1 of the display apparatus 1 may include molybdenum (Mo).

Referring to FIG. 9, the first upper layer GH1 of the first gate electrode G1 may be thicker than the first lower layer GL1 of the first gate electrode G1. The first lower layer GL1 of the first gate electrode G1 may have a first thickness t1 from an upper surface of the first insulating layer 103, and the first upper layer GH1 of the first gate electrode G1 may have a second thickness t2 from an upper surface of the first lower layer GL1 of the first gate electrode G1.

According to an embodiment, the first thickness t1 may be in a range of about 250 Å to about 1200 Å, in a range of about 200 Å to about 1400 Å, or in a range of about 250 Å to about 1000 Å. In such an embodiment, various modifications may be made within the above ranges. In an embodiment, the second thickness t2 may be in a range of about 2000 Å to about 7000 Å, in a range of about 1800 Å to about 7500 Å, or in a range of about 2000 Å to about 10000 Å. In such an embodiment, various modifications may be made within the above ranges.

In an embodiment, as described above with reference to FIG. 10, because the resistivity of the upper layer including molybdenum (Mo) arranged on the lower layer including tungsten (W) decreases when the lower layer including tungsten (W) has a thickness of 250 Å or greater, the first lower layer GL1 of the first gate electrode G1 may have a thickness of about 250 Å or greater. As the lower layer including tungsten (W) has a larger thickness, the upper layer including molybdenum (Mo) may be stacked on the lower layer including tungsten (W) to have a larger thickness. However, as the thickness of the lower layer including tungsten (W) increases, material costs and a process loss increase, and thus a cost loss may occur and a burden may be applied to a process. In an embodiment, as described above, the first upper layer GH1 may have a thickness in a range of about 2000 Å to about 7000 Å. Accordingly, when the first upper layer GH1 has a thickness of about 7000 Å, the first lower layer GL1 may have a thickness of about 1200 Å such that the resistivity of the first upper layer GH1 may be sufficiently or effectively reduced.

Accordingly, the first lower layer GL1 of the first gate electrode G1 may have a thickness in a range of about 250 Å to about 1200 Å.

In an embodiment where a gate electrode includes a lower layer including tungsten (W) or a tungsten (W) alloy and an upper layer including molybdenum (Mo), stress of the gate electrode may be reduced, leading to a stable increase in the thickness of the molybdenum (Mo), and thus the resistance of the gate electrode may be decreased.

Referring back to FIG. 8, in an embodiment of the display apparatus 1, the second gate electrode G2 may be on the first insulating layer 103. The second gate electrode G2 may include a same material as that included in the first gate electrode G1. The second gate electrode G2 may include a fifth lower layer GL5 and a fifth upper layer GH5 arranged on the fifth lower layer GL5 and including a different material from the fifth lower layer GL5. The fifth upper layer GH5 of the second gate electrode G2 may be thicker than the fifth lower layer GL5 of the second gate electrode G2. According to an embodiment, the fifth lower layer GL5 of the second gate electrode G2 may include a same material as and have a same thickness as the first lower layer GL1 of the first gate electrode G1, and the fifth upper layer GH5 of the second gate electrode G2 may include a same material as and have a same thickness as the first upper layer GH1 of the first gate electrode G1.

In an embodiment of the display apparatus 1, a second insulating layer 105 may be on the first and second gate electrodes G1 and G2. The second insulating layer 105 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 105 may have a single layer structure or a multi-layer structure including the aforementioned inorganic insulating material.

According to an embodiment, a storage capacitor Cst including the first gate electrode G1 and an upper electrode CE2 overlapping the first gate electrode G1 with the second insulating layer 105 therebetween may be above the substrate 100. The storage capacitor Cst may have a structure in which a lower electrode thereof is defined by the first gate electrode G1 of the first thin-film transistor TFT1.

According to an alternative embodiment, although not shown in FIG. 8, a storage capacitor Cst including the lower electrode and an upper electrode CE2 overlapping the lower electrode with the second insulating layer 105 therebetween may be above the substrate 100. In such an embodiment, the lower electrode is an independent component that is spaced apart from a gate electrode, and may include a same material as the gate electrode, and may have a same shape as the gate electrode.

In an embodiment, the upper electrode CE2 of the storage capacitor Cst may be on the second insulating layer 105. The upper electrode CE2 of the storage capacitor Cst may include at least one metal selected from molybdenum (Mo), titanium (Ti) and tungsten (W), and may have a single layer structure or a multi-layer structure.

In an embodiment where an upper electrode includes or is formed of molybdenum (Mo), and molybdenum (Mo) is formed to have a thickness of 2700 Å or greater to reduce the resistance of the upper electrode, a substrate may be bent due to the tensile stress of a molybdenum (Mo) thin film. In a case where aluminum (Al), copper (Cu), and silver (Ag) instead of molybdenum (Mo) are used to form the upper electrode, a dry etching process may be impossible (e.g., when using Cu and Ag), or a Hillock phenomenon, in which a big or small protrusion is formed on the surface of a thin film, may occur (e.g., when using Al).

The upper electrode CE2 of the display apparatus 1 may include a second lower layer GL2 and a second upper layer GH2 arranged on the second lower layer GL2 and including a different material from the second lower layer GL2. According to an embodiment, the second lower layer GL2 of the upper electrode CE2 may include tungsten (W). In such an embodiment, the second lower layer GL2 of the upper electrode CE2 may include tungsten (W). According to an alternative embodiment, the second lower layer GL2 of the upper electrode CE2 may include a tungsten (W) alloy including tungsten (W) and a second element. In such an embodiment, a content of the second element of the tungsten (W) alloy may be less than 50 wt %, and the second element may be selected from titanium (Ti), zirconium (Zr) and hafnium (Hf). In one embodiment, for example, the second lower layer GL2 of the upper electrode CE2 may include a titanium-tungsten alloy (TiW).

In an embodiment, the second upper layer GH2 of the upper electrode CE2 of the display apparatus 1 may include molybdenum (Mo). In such an embodiment, the second upper layer GH2 of the upper electrode CE2 may include molybdenum (Mo).

Referring to FIG. 9, the second upper layer GH2 of the upper electrode CE2 may be thicker than the second lower layer GL2 of the upper electrode CE2. The second lower layer GL2 of the upper electrode CE2 may have a third thickness t3 from the upper surface of the second insulating layer 105, and the second upper layer GH2 of the upper electrode CE2 may have a fourth thickness t4 from the upper surface of the second lower layer GL2 of the upper electrode CE2.

According to an embodiment, the third thickness t3 may be in a range of about 250 Å to about 1200 Å, in a range of about 200 Å to about 1400 Å, or in a range of about 250 Å to about 1000 Å. In such an embodiment, various modifications may be made within the above ranges. The fourth thickness t4 may be about 2000 Å to about 7000 Å, about 1800 Å to about 7500 Å, or about 2000 Å to about 10000 Å. In such an embodiment, various modifications may be made within the above ranges.

In an embodiment, as described above with reference to FIG. 10, because the resistivity of the upper layer including molybdenum (Mo) arranged on the lower layer including tungsten (W) decreases when the lower layer including tungsten (W) has a thickness of 250 Å or greater, the second lower layer GL2 of the upper electrode CE2 may have a thickness of about 250 Å or greater. As the lower layer including tungsten (W) has a larger thickness, the upper layer including molybdenum (Mo) may be stacked on the lower layer including tungsten (W) to have a larger thickness. However, as the thickness of the lower layer including tungsten (W) increases, material costs and a process loss increase, and thus a cost loss may occur and a burden may be applied to a process. In an embodiment, the second upper layer GH2 may have a thickness in a range of about 2000 Å to about 7000 Å. Accordingly, when the second upper layer GH2 has a thickness of about 7000 Å, the second lower layer GL2 may have a thickness of about 1200 Å such that the resistivity of the second upper layer GH2 may be sufficiently or effectively reduced.

Accordingly, the second lower layer GL2 of the upper electrode CE2 may have a thickness in a range of about 250 Å to about 1200 Å.

In an embodiment, where an upper electrode includes a lower layer including tungsten (W) or a tungsten (W) alloy and an upper layer including molybdenum (Mo), stress of the upper electrode may be reduced, leading to a stable increase in the thickness of the molybdenum (Mo), and thus the resistance of the upper electrode may be decreased.

Referring back to FIG. 8, in an embodiment of the display apparatus 1, a third insulating layer 107 may be on the upper electrode CE2 of the storage capacitor Cst. The third insulating layer 107 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The third insulating layer 107 may have a single layer structure or a multi-layer structure including the aforementioned inorganic insulating material.

The first source electrode S1 and the first drain electrode D1, which are the connecting electrodes, may be on the third insulating layer 107. Each of the first source electrode S1 and the second drain electrode D1 may include a conductive material including at least one selected from, for example, Mo, Al, Cu and Ti, and may have single layer structure or a multi-layer structure including the aforementioned materials. In one embodiment, for example, each of the first source electrode S1 and the first drain electrode D1 may be a multi-layer of Ti/Al/Ti.

The second source electrode S2 and the second drain electrode D2, which are the connecting electrodes, may be on the third insulating layer 107. The second source electrode S2 and the second drain electrode D2 may include a same material as the above-described material included in the first source electrode S1 and the first drain electrode D1.

In an embodiment of the display apparatus 1, a planarization layer 113 may be on the first source electrode S1 and the first drain electrode D1. The planarization layer 113 may be a single layer including an organic or inorganic material or a multi-layer formed by stacking single layers, each including an organic or inorganic material. The planarization layer 113 may include a commercially available polymer such as benzocyclobutene ("BOB"), polyimide ("PI"), hexamethyldisiloxane ("HMDSO"), polymethyl methacrylate ("PMMA") or polystyrene ("PS"), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. In an embodiment, after the planarization layer 113 is formed, chemical and mechanical polishing may be performed to provide a flat upper surface.

In an embodiment of the display apparatus 1, a contact hole CNT for electrical connection between the first thin-film transistor TFT1 and a pixel electrode 210 may be defined in the planarization layer 113. The thin-film transistor of the display apparatus 1 (for example, the first thin-film transistor TFT1) and the display element thereof (for example, the organic light-emitting diode OLED) may be electrically connected to each other via the contact hole CNT defined in the planarization layer 113.

The display element (for example, the organic light-emitting diode OLED) includes the pixel electrode 210, an intermediate layer 220 and an opposite electrode 230, and may be arranged on the planarization layer 113. The pixel electrode 210 may be electrically connected to the first source electrode S1 or the first drain electrode D1 of the thin-film transistor TFT (for example, the first thin-film transistor TFT1) via the contact hole CNT defined in the planarization layer 113.

The pixel electrode 210 may be on the planarization layer 113. The pixel electrode 210 may be a (semi) light-transmissive electrode or a reflective electrode. The pixel electrode 210 may include a reflection layer including aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or a compound thereof, and a transparent or semi-transparent electrode layer on the reflection layer. The transparent or semi-transparent electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In one embodiment, for example, the pixel electrode 210 may have a stack structure of ITO/Ag/ITO.

In an embodiment of the display apparatus 1, a pixel defining layer 180 may be located on the planarization layer 113. An opening OP exposing at least a portion of the pixel electrode 210 may be defined in the pixel defining layer 180. A region exposed via the opening OP of the pixel defining layer 180 may be defined as a light-emission region. The vicinity of light-emission regions is a non-light-emission region, and the non-light-emission region may surround the light-emission regions. In such an embodiment, the display area DA may include a plurality of light-emission regions and a non-light-emission region that surround the plurality of light-emission regions. The pixel defining layer 180 prevents an arc from occurring on the edge of the pixel electrode 210 by increasing a distance between the pixel electrode 210 and the opposite electrode 230 over the pixel electrode 210. The pixel defining layer 180 may include or be formed of an organic insulating material, such as PI, polyamide, acryl resin, benzocyclobutene, hexamethyldisiloxane ("HMDSO"), or phenol resin, via spin coating or the like.

In an embodiment of the display apparatus 1, a spacer 190 may be on the pixel defining layer 180. The spacer 190 may prevent layers between the substrate 100 and the spacer 190 from being damaged by a mask that is used to form the intermediate layer 220, which will be described later. The spacer 190 may include a same material as the material included in the pixel defining layer 180, and may be formed simultaneously with the pixel defining layer 180 by using a halftone mask.

The intermediate layer 220 may be arranged within the opening OP of the pixel defining layer 180 to correspond to the pixel electrode 210. The intermediate layer 220 may include an emission layer 220b, and a first functional layer 220a and a second functional layer 220c may be selectively arranged below and above the emission layer 220b.

The first functional layer 220a may include a hole injection layer ("HIL") and/or a hole transport layer ("HTL"), and the second functional layer 220c may include an electron transport layer ("ETL") and/or an electron injection layer ("EIL").

The emission layer 220b may include an organic material including a fluorescent or phosphorescent material that emits red, green, blue, or white light. The emission layer 220b may include a low-molecular weight organic material or a high-molecular weight organic material.

In an embodiment, where the emission layer 220b includes a low molecular weight material, the intermediate layer 220 may be a stack of an HIL, an HTL, the emission layer 220b, an ETL, and an EIL in a single structure or a composite structure, and may include, as the low molecular weight material, any of various materials including copper phthalocyanine ("CuPc"), N,N'-Di(naphthalene-1-yl)-N,N'-diphenyl-benzidine ("NPB"), or tris-8-hydroxyquinoline aluminum ("Alq3"). These layers may be formed via vacuum deposition.

In an embodiment, where the emission layer 220b includes a high-molecular weight material, the intermediate layer 220 may generally have a structure including an HTL and the emission layer 220b. In such an embodiment, the HTL may include poly(ethylenedioxythiophene) ("PEDOT"), and the emission layer 220b may include a high-molecular weight material such as a polyphenylene vinylene ("PPV")-based material or a polyfluorene-based material. The emission layer 220b may be formed via screen printing, inkjet printing, laser induced thermal imaging ("LITI"), or the like.

Each of the first functional layer 220a and the second functional layer 220c arranged below and above the emission layer 220b may be integrally formed as a single unitary unit over the entire substrate 100 to cover a plurality of pixels P arranged in the display area DA by using an open mask.

The opposite electrode 230 may be on the intermediate layer 220. The opposite electrode 230 may be on the intermediate layer 220 to cover the entire intermediate layer 220. The opposite electrode 230 may be over the display area DA to cover the entire display area DA. In such an embodiment, the opposite electrode 230 may be integrally formed as a single unitary unit over the entire substrate 100 to cover the plurality of pixels P arranged in the display area DA by using an open mask.

The opposite electrode 230 may include a conductive material having a low work function. In one embodiment, for example, the opposite electrode 230 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 230 may further include a layer, such as ITO, IZO, ZnO, or $In_2O_3$, on the (semi)transparent layer including any of the above-described materials.

Figure 12:
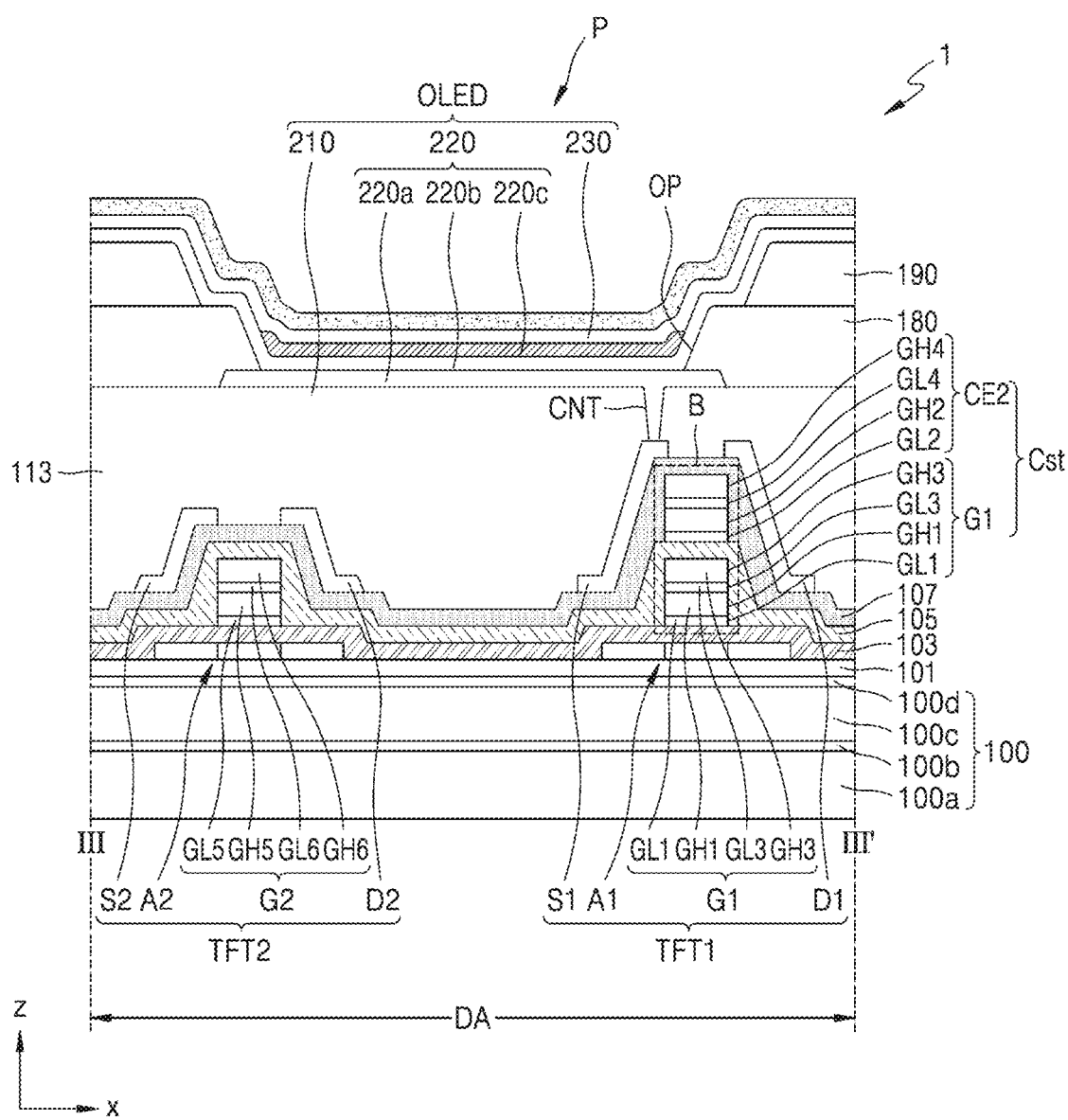
FIG. 12 is a schematic cross-sectional view of a display apparatus according to an alternative embodiment.
Figure 13:
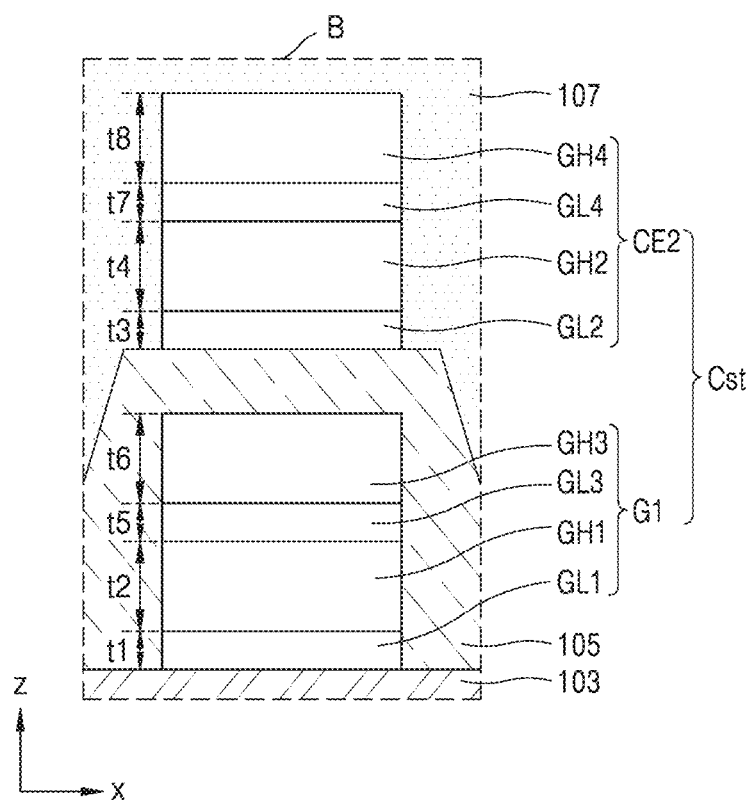
FIG. 13 is a schematic cross-sectional view of a display apparatus according to an embodiment.

FIG. 12 is a schematic cross-sectional view of a display apparatus according to an alternative embodiment of the disclosure, and FIG. 13 is a schematic cross-sectional view of a display apparatus according to an embodiment of the disclosure. FIG. 13 is an enlarged view of a portion B of FIG. 12.

The embodiment shown in FIG. 12 is substantially the same as the embodiments described above with reference FIG. 8 except that a first gate electrode further includes a third lower layer and a third upper layer and an upper electrode further includes a fourth lower layer and a fourth upper layer. The same or like elements shown in FIG. 12 have been labeled with the same reference characters as used above to describe the embodiments of the display apparatus shown in FIG. 8, and any repetitive detailed description thereof will hereinafter be omitted or simplified.

Referring to FIG. 12, in an embodiment, a gate electrode (for example, a first gate electrode G1) of a display apparatus 1 may include a first lower layer GL1 and a first upper layer GH1 arranged on the first lower layer GL1 and including a different material from the first lower layer GL1, and may include a third lower layer GL3 and a third upper layer GH3 arranged on the third lower layer GL3 and including a different material from the third lower layer GL3.

In an embodiment, the first lower layer GL1 and the third lower layer GL3 of the first gate electrode G1 of the display apparatus 1 may include tungsten (W). According to an alternative embodiment, the first lower layer GL1 and the third lower layer GL3 of the first gate electrode G1 may include a tungsten (W) alloy including tungsten (W) and a first element. In such an embodiment, a content of the first element of the tungsten (W) alloy may be less than 50 wt %, and the first element may be selected from titanium (Ti), zirconium (Zr) and hafnium (Hf). In one embodiment, for example, the first lower layer GL1 and the third lower layer GL3 of the first gate electrode G1 may include a titanium-tungsten alloy (TiW).

The first upper layer GH1 and the third upper layer GH3 of the first gate electrode G1 of the display apparatus 1 may include molybdenum (Mo).

Referring to FIG. 13, the first upper layer GH1 of the first gate electrode G1 may be thicker than the first lower layer GL1 of the first gate electrode G1, and the third upper layer GH3 of the first gate electrode G1 may be thicker than the third lower layer GL3 of the first gate electrode G1.

The first lower layer GL1 of the first gate electrode G1 may have a first thickness t1 from the upper surface of the first insulating layer 103, the first upper layer GH1 of the first gate electrode G1 may have a second thickness t2 from the upper surface of the first lower layer GL1 of the first gate electrode G1, the third lower layer GL3 of the first gate electrode G1 may have a fifth thickness t5 from the upper surface of the first upper layer GH1, and the third upper layer GH3 of the first gate electrode G1 may have a sixth thickness t6 from the upper surface of the third lower layer GL3. According to an embodiment, each of the first thickness t1 and the fifth thickness t5 may be in a range of about 250 Å to about 600 Å, in a range of about 200 Å to about 700 Å, or in a range of about 250 Å to about 500 Å. In such an embodiment, various modifications may be made within the above ranges. In an embodiment, for example, the first thickness t1 and the fifth thickness t5 may be equal to each other. According to an embodiment, the second thickness t2 and the sixth thickness t6 may be in a range of about 1000 Å to about 3500 Å, in a range of about 1200 Å to about 3700 Å, or in a range of about 2000 Å to about 4000 Å. In such an embodiment, various modifications may be made within the above ranges. In one embodiment, for example, the second thickness t2 and the sixth thickness t6 may be equal to each other.

In such an embodiment, as described above with reference to FIG. 10, because the resistivity of the upper layer including molybdenum (Mo) arranged on the lower layer including tungsten (W) decreases when the lower layer including tungsten (W) has a thickness of 250 Å or greater, the first lower layer GL1 and the third lower layer GL3 of the first gate electrode G1 may have a thickness of about 250 Å or greater. As the lower layer including tungsten (W) has a larger thickness, the upper layer including molybdenum (Mo) may be stacked on the lower layer including tungsten (W) to have a larger thickness. However, as the thickness of the lower layer including tungsten (W) increases, material costs and a process loss increase, and thus a cost loss may occur and a burden may be applied to a process. In an embodiment, as described above, each of the first upper layer GH1 and the third upper layer GH3 may have a thickness in a range of about 1000 Å to about 3500 Å. Accordingly, when each of the first upper layer GH1 and the third upper layer GH3 has a thickness of about 3500 Å, each of the first lower layer GL1 and the third lower layer GL3 may have a thickness of about 600 Å such that the resistivity of each of the first upper layer GH1 and the third upper layer GH3 may be sufficiently or effectively reduced.

Accordingly, the first lower layer GL1 and the third lower layer GL3 of the first gate electrode G1 may have a thickness in a range of about 250 Å to about 600 Å.

In an embodiment, as described above, the gate electrode (for example, the first gate electrode G1) has a stack structure of upper layer/lower layer/upper layer/lower layer (for example, the third upper layer GH3/the third lower layer GL3/the first upper layer GH1/the first lower layer GL1), such that stress of the gate electrode is reduced, and thus the thickness of molybdenum (Mo) may stably increase, leading to a decrease in the resistance of the gate electrode.

Referring back to FIG. 12, the second gate electrode G2 may be on the first insulating layer 103. The second gate electrode G2 may include a same material as that included in the first gate electrode G1. The second gate electrode G2 may include a fifth lower layer GL5 and a fifth upper layer GH5 arranged on the fifth lower layer GL5 and including a different material from the fifth lower layer GL5, and may include a sixth lower layer GL6 and a sixth upper layer GH6 arranged on the sixth lower layer GL6 and including a different material from the sixth lower layer GL6.

The fifth upper layer GH5 of the second gate electrode G2 may be thicker than the fifth lower layer GL5 of the second gate electrode G2, and the sixth upper layer GH6 of the second gate electrode G2 may be thicker than the sixth lower layer GL6 of the second gate electrode G2. According to an embodiment, the fifth lower layer GL5 of the second gate electrode G2 may include a same material as and have a same thickness as the first lower layer GL1 of the first gate electrode G1, and the sixth lower layer GL6 of the second gate electrode G2 may include a same material as and have a same thickness as the third lower layer GL3 of the first gate electrode G1. The fifth upper layer GH5 of the second gate electrode G2 may include a same material as and have a same thickness as the first upper layer GH1 of the first gate electrode G1, and the sixth upper layer GH6 of the second gate electrode G2 may include a same material as and have a same thickness as the third upper layer GH3 of the first gate electrode G1.

The upper electrode CE2 of the storage capacitor Cst may be on the second insulating layer 105. The upper electrode CE2 of the storage capacitor Cst may include at least one metal selected from molybdenum (Mo), titanium (Ti) and tungsten (W), and may have a single layer structure or a multi-layer structure.

In an embodiment, the upper electrode CE2 of the display apparatus 1 may include a second lower layer GL2 and a second upper layer GH2 arranged on the second lower layer GL2 and including a different material from the second lower layer GL2, and may include a fourth lower layer GL4 and a fourth upper layer GH4 arranged on the fourth lower layer GL4 and including a different material from the fourth lower layer GL4.

The second lower layer GL2 and the fourth lower layer GL4 of the upper electrode CE2 of the display apparatus 1 may include tungsten (W). According to an alternative embodiment, the second lower layer GL2 and the fourth lower layer GL4 of the upper electrode CE2 may include a tungsten (W) alloy including tungsten (W) and a second element. In such an embodiment, a content of the second element of the tungsten (W) alloy may be less than about 50 wt %, and the second element may be selected from titanium (Ti), zirconium (Zr) and hafnium (Hf). In one embodiment, for example, the second lower layer GL2 and the fourth lower layer GL4 of the upper electrode CE2 may include a titanium-tungsten alloy (TiW).

The second upper layer GH2 and the fourth upper layer GH4 of the upper electrode CE2 of the display apparatus 1 may include molybdenum (Mo).

Referring to FIG. 13, the second upper layer GH2 of the upper electrode CE2 may be thicker than the second lower layer GL2 of the upper electrode CE2, and the fourth upper layer GH4 of the upper electrode CE2 may be thicker than the fourth lower layer GL4 of the upper electrode CE2. The second lower layer GL2 of the upper electrode CE2 may have a third thickness t3 from the upper surface of the second insulating layer 105, the second upper layer GH2 of the upper electrode CE2 may have a fourth thickness t4 from the upper surface of the second lower layer GL2 of the upper electrode CE2, the fourth lower layer GL4 of the upper electrode CE2 may have a seventh thickness t7 from the upper surface of the second upper layer GH2, and the fourth upper layer GH4 of the upper electrode CE2 may have an eighth thickness t8 from the upper surface of the fourth lower layer GL4. According to an embodiment, the third thickness t3 and the seventh thickness t7 may be in a range of about 250 Å to about 600 Å, in a range of about 200 Å to about 700 Å, or in a range of about 250 Å to about 500 Å. In such an embodiment, various modifications may be made within the above ranges. In one embodiment, for example, the third thickness t3 and the seventh thickness t7 may be equal to each other. According to an embodiment, the fourth thickness t4 and the eighth thickness t8 may be in a range of about 1000 Å to about 3500 Å, in a range of about 1200 Å to about 3700 Å, or in a range of about 2000 Å to about 4000 Å. In such an embodiment, various modifications may be made within the above ranges. In one embodiment, for example, the fourth thickness t4 and the eighth thickness t8 may be equal to each other.

In an embodiment, as described above with reference to FIG. 10, because the resistivity of the upper layer including molybdenum (Mo) arranged on the lower layer including tungsten (W) decreases when the lower layer including tungsten (W) has a thickness of 250 Å or greater, the second lower layer GL2 and the fourth lower layer GL4 of the upper electrode CE2 may have a thickness of about 250 Å or greater. As the lower layer including tungsten (W) has a larger thickness, the upper layer including molybdenum (Mo) may be stacked on the lower layer including tungsten (W) to have a larger thickness. However, as the thickness of the lower layer including tungsten (W) increases, material costs and a process loss increase, and thus a cost loss may occur and a burden may be applied to a process. In an embodiment, each of the second upper layer GH2 and the fourth upper layer GH4 of the upper electrode CE2 may have a thickness in a range of about 1000 Å to about 3500 Å. Accordingly, when each of the second upper layer GH2 and the fourth upper layer GH4 has a thickness of about 3500 Å, each of the second lower layer GL2 and the fourth lower layer GL4 may have a thickness of about 600 Å such that the resistivity of each of the second upper layer GH2 and the fourth upper layer GH4 may be sufficiently or effectively reduced.

Accordingly, the second lower layer GL2 and the fourth lower layer GL4 of the upper electrode CE2 may have a thickness in a range of about 250 Å to about 600 Å.

In an embodiment, the upper electrode CE2 has a stack structure of upper layer/lower layer/upper layer/lower layer (for example, the fourth upper layer GH4/the fourth lower layer GL4/the second upper layer GH2/the second lower layer GL2), such that stress of the upper electrode CE2 is reduced, and thus the thickness of molybdenum (Mo) may stably increase, leading to a decrease in the resistance of the upper electrode CE2.

According to an embodiment, the gate electrode (for example, the first gate electrode G1 and the second gate electrode G2) may include a plurality of first lower layers including tungsten (W) or a tungsten alloy including tungsten (W) and a first element and a plurality of first upper layers including molybdenum (Mo), the plurality of first lower layers may be stacked alternately with the plurality of first upper layers, and one of the plurality of first lower layers may be closest to the substrate 100. In one embodiment, for example, the gate electrode may include a first lower layer and a first upper layer arranged on the first lower layer, another first lower layer and another first upper layer arranged on the other first lower layer, and another first lower layer and another first upper layer arranged on the other first lower layer. In such an embodiment, where the plurality of first lower layers alternate with the plurality of first upper layers, the gate electrode may have a multi-layer structure.

A content of the first element of the tungsten (W) alloy may be less than about 50 wt %, and the first element may be selected from titanium (Ti), zirconium (Zr) and hafnium (Hf). In one embodiment, for example, each first lower layer of the gate electrode may include a titanium-tungsten alloy (TiW).

In an embodiment, where the plurality of first lower layers alternately stacked with the plurality of first upper layers, each of the plurality of first upper layers may have a greater thickness than each of the plurality of first lower layers. A thickness of the gate electrode corresponding to a total sum of the thicknesses of the plurality of first upper layers and the plurality of first lower layers may be in a range of about 2250 Å to about 8200 Å, in a range of about 2000 Å to about 8500 Å, or in a range of about 2500 Å to about 7500 Å. In such an embodiment, various modifications may be made within the above ranges.

In such an embodiment, the gate electrode (for example, the first gate electrode G1 and the second gate electrode G2) includes a plurality of lower layers (for example, the plurality of first lower layers) including tungsten (W) or a tungsten (W) alloy and a plurality of upper layer (for example, the plurality of first upper layers) including molybdenum (Mo) and the plurality of lower layers alternately stacked with the plurality of upper layers, such that stress of the gate electrode is reduced, and thus the thickness of molybdenum (Mo) may stably increase, leading to a decrease in the resistance of the gate electrode.

According to an embodiment, the storage capacitor Cst may include the gate electrode, and an upper electrode that overlaps the gate electrode. The storage capacitor Cst may have a structure in which a lower electrode thereof is defined by the gate electrode.

According to an alternative embodiment, the storage capacitor Cst may include a lower electrode, and an upper electrode that overlaps the lower electrode. In such an embodiment, the lower electrode is spaced apart from a gate electrode, and may include a same material as the gate electrode, and may have a same shape as the gate electrode.

According to an embodiment, an upper electrode of a storage capacitor may include a plurality of second lower layers including tungsten (W) or a tungsten alloy including tungsten (W) and a second element and a plurality of second upper layers including molybdenum (Mo), the plurality of second lower layers may be stacked alternately with the plurality of second upper layers, and one of the plurality of second lower layers may be closest to the substrate 100. In one embodiment, for example, the upper electrode may include a second lower layer and a second upper layer arranged on the second lower layer, another second lower layer and another second upper layer arranged on the other second lower layer, and another second lower layer and another second upper layer arranged on the other second lower layer. In such an embodiment, where the plurality of second lower layers are stacked alternately with the plurality of second upper layers, the upper electrode may have a multi-layer structure.

A content of the second element of the tungsten alloy may be less than about 50 wt %, and the second element may be selected from titanium (Ti), zirconium (Zr) and hafnium (Hf). In one embodiment, for example, each second lower layer of the upper electrode may include a titanium-tungsten alloy (TiW).

In such an embodiment, where the plurality of second lower layers is alternately stacked with the plurality of second upper layers, each of the plurality of second upper layers may have a greater thickness than each of the plurality of second lower layers. In an embodiment, a thickness of the upper and lower electrodes corresponding to a total sum of the thicknesses of the plurality of second upper layers and the plurality of second lower layers may be in a range of about 2250 Å to about 8200 Å, in a range of about 2000 Å to about 8500 Å, or in a range of about 2500 Å to about 7500 Å. In such an embodiment, various modifications may be made within the above ranges.

In an embodiment, where the upper electrode includes a plurality of lower layers (for example, the plurality of second lower layers) including tungsten (W) or a tungsten (W) alloy and a plurality of upper layer (for example, the plurality of second upper layers) including molybdenum (Mo), and the plurality of lower layers are alternately stacked with the plurality of upper layers, stress of the upper electrode is reduced, and thus the thickness of molybdenum (Mo) may stably increase, leading to a decrease in the resistance of the upper electrode.

Figure 14:
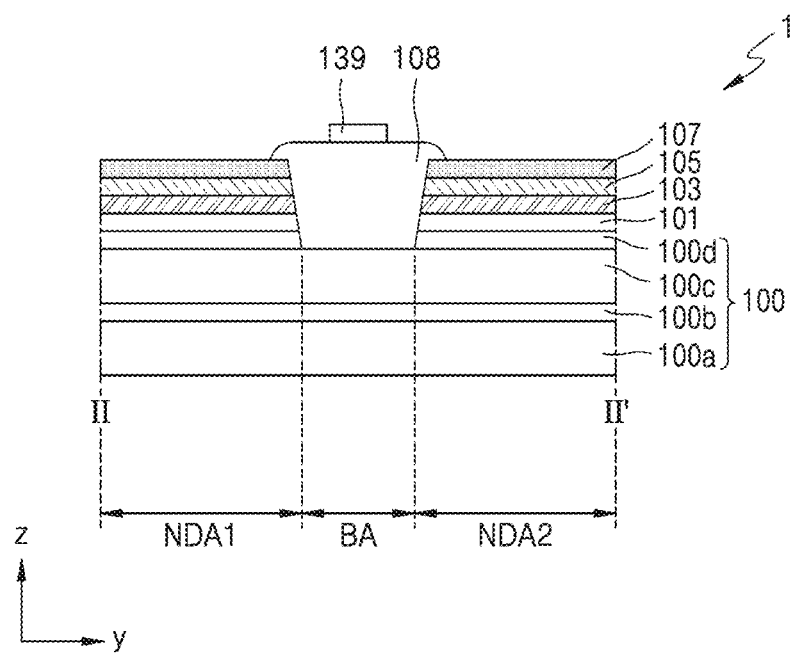
FIG. 14 is a schematic cross-sectional view of a display apparatus according to an embodiment.

FIG. 14 is a schematic cross-sectional view of a display apparatus 1 according to an embodiment of the disclosure. FIG. 14 is a cross-sectional view of the display apparatus 1 taken along line II-II' of FIG. 1.

Referring to FIG. 14, the first non-display area NDA1 and the second non-display area NDA2 may be defined on the substrate 100 based on the bending area BA. The substrate 100 may include the first substrate 100a, the first barrier layer 100b on the first substrate 100a, the second substrate 100c on the first barrier layer 100b, and the second barrier layer 100d on the second substrate 100c. In one embodiment, for example, the first substrate 100a and the second substrate 100c may include PI. In an embodiment of the display apparatus 1, a buffer layer 101 may be on the substrate 100 of the first non-display area NDA1 and the second non-display area NDA2. The buffer layer 101 may be positioned on the substrate 100 and may reduce or prevent infiltration of a foreign material, moisture, or ambient air from below the substrate 100 and may provide a flat surface on the substrate 100. The buffer layer 101 may include an inorganic material (such as oxide or nitride), an organic material, or an organic and inorganic compound, and may have a single layer structure or a multi-layer structure of an inorganic material and an organic material.

In an embodiment of the display apparatus 1, a first insulating layer 103 may be on the buffer layer 101 of the first non-display area NDA1 and the second non-display area NDA2. The first insulating layer 103 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may have a single layer structure or a multi-layer structure including the aforementioned inorganic insulating material.

In an embodiment of the display apparatus 1, a second insulating layer 105 may be on the first insulating layer 103 of the first non-display area NDA1 and the second non-display area NDA2. The second insulating layer 105 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 105 may have a single layer structure or a multi-layer structure including the aforementioned inorganic insulating material.

In an embodiment of the display apparatus 1, a third insulating layer 107 may be on the second insulating layer 105 of the first non-display area NDA1 and the second non-display area NDA2. The third insulating layer 107 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The third insulating layer 107 may have a single layer structure or a multi-layer structure including the aforementioned inorganic insulating material.

In an embodiment of the display apparatus 1, an organic layer 108 may be on the substrate 100 of the bending area BA. The organic layer 108 may include a commercially available polymer such as BCB, PI, HMDSO, PMMA or PS, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like.

In an embodiment of the display apparatus 1, a first conductive layer 139 may be on the organic layer 108 of the bending area BA. The first conductive layer 139 may include a same material as that included in the first source electrode S1 of FIG. 8 or the first drain electrode D1 of FIG. 8.

According to an embodiment, after the buffer layer 101, the first insulating layer 103, the second insulating layer 105, and the third insulating layer 107 are integrally formed over or to cover all of the bending area BA, the first non-display area NDA1 and the second non-display area NDA2, respective portions of the buffer layer 101, the first insulating layer 103, the second insulating layer 105 and the third insulating layer 107 located on the bending area BA may be removed.

In one embodiment, for example, while the respective portions of the buffer layer 101, the first insulating layer 103, the second insulating layer 105, and the third insulating layer 107 located on the bending area BA are being removed, the second barrier layer 100d may also be removed.

In an embodiment, as shown in FIG. 14, at least a portion of the organic layer 108 may extend toward the first non-display area NDA1 and the second non-display area NDA2. Accordingly, at least a portion of the organic layer 108 may be on the first non-display area NDA1 and the second non-display area NDA2.

In such an embodiment, because insulating layers including an inorganic insulating material are removed from the bending area BA and the organic layer 108 including an organic insulating material is arranged on the bending area BA, propagation of cracks toward the display area DA may be effectively prevented, and a bending strain on the bending area BA may be improved, thereby realizing a reliable display apparatus.

Figure 15:
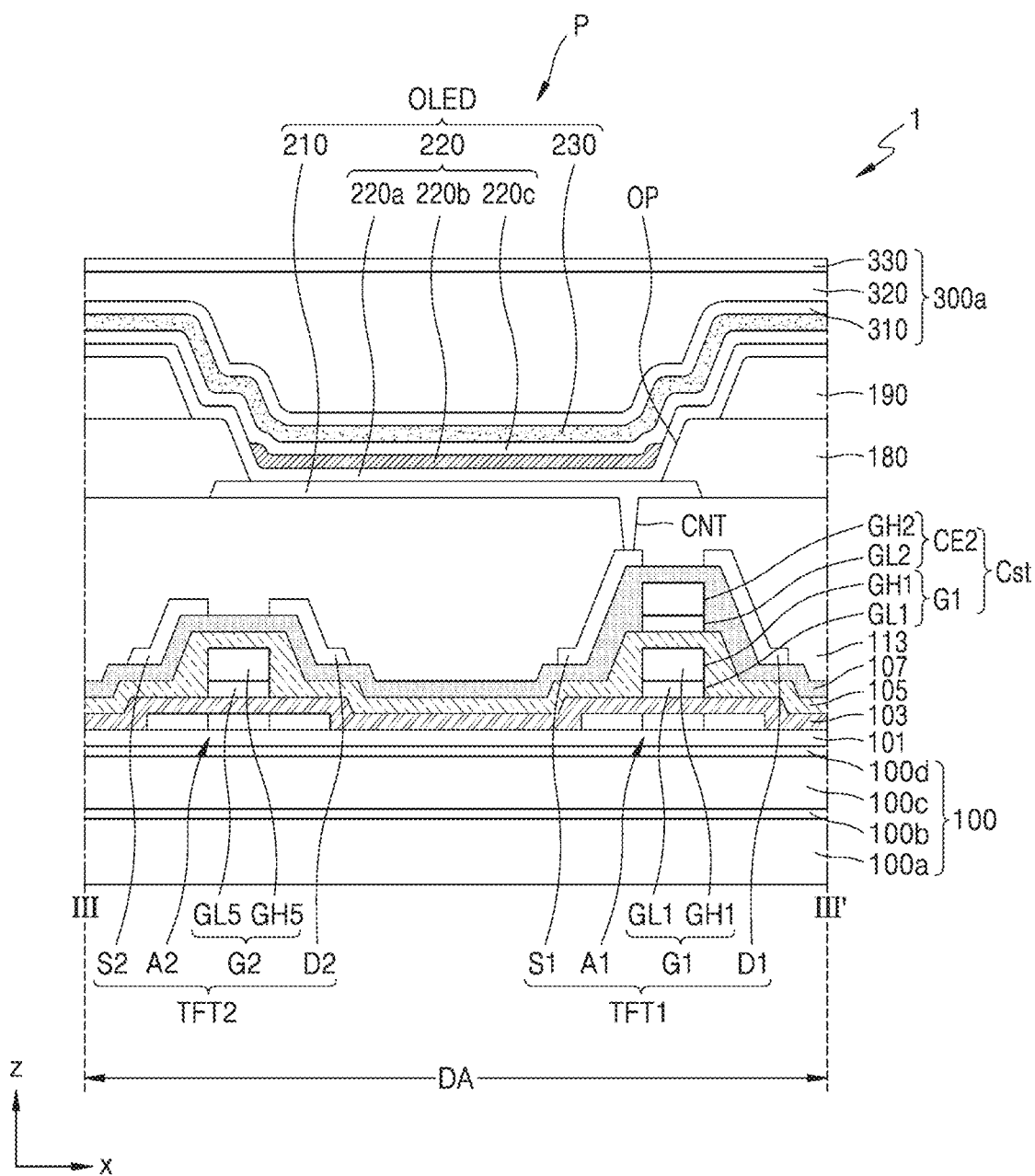
FIGS. 15 and 16 are schematic cross-sectional views of a display apparatus according to an embodiment.
Figure 16:
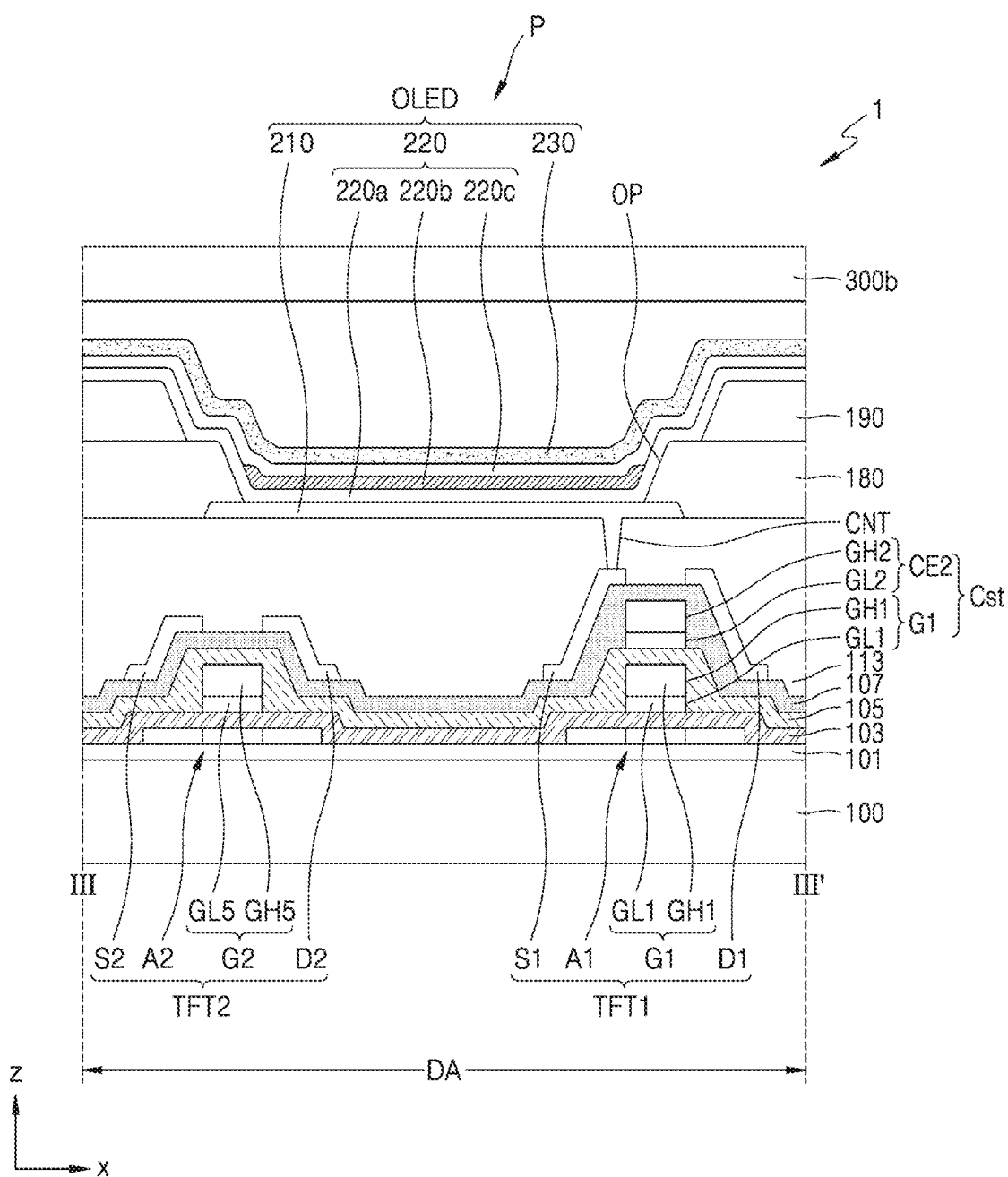

FIGS. 15 and 16 are schematic cross-sectional views of a display apparatus according to an embodiment.

Referring to FIG. 15, in an embodiment a display apparatus 1, the thin-film transistor TFT (for example, the first thin-film transistor TFT1, and the second thin-film transistor TFT2) and the organic light-emitting diode OLED as the display element may be arranged on the substrate 100, the thin-film transistor TFT and the organic light-emitting diode OLED may be electrically connected to each other, and a thin-film encapsulation layer 300a may be arranged on the organic light-emitting diode OLED. The thin-film encapsulation layer 300a may be arranged on the substrate 100 to face the substrate 100.

The substrate 100 may include a polymer resin. The substrate 100 may include the first substrate 100a, the first barrier layer 100b on the first substrate 100a, the second substrate 100c on the first barrier layer 100b, and the second barrier layer 100d on the second substrate 100c. In one embodiment, for example, the first substrate 100a and the second substrate 100c may include PI.

The organic light-emitting diode OLED, which is a display element, may be covered by the thin-film encapsulation layer 300a. The thin-film encapsulation layer 300 may include an organic encapsulation layer and an inorganic encapsulation layer. According to an embodiment, the thin-film encapsulation layer 300a may include first and second inorganic encapsulation layers 310 and 330 and an organic encapsulation layer 320 therebetween.

Each of the first and second inorganic encapsulation layer 310 and 330 may include one or more inorganic insulating materials. The inorganic insulating materials may include, for example, aluminum oxide, titanium oxide, tantalum oxide, hafnium oxide, zinc oxide, silicon oxide, silicon nitride, and/or silicon oxynitride. The organic encapsulation layer 320 may include a polymer-based material. The polymer-based material may include an acrylic resin, an epoxy-based resin, polyimide, and polyethylene. In one embodiment, for example, the organic encapsulation layer 320 may include an acrylic resin, for example, polymethyl methacrylate or polyacrylic acid.

Referring to FIG. 16, in an alternative embodiment a display apparatus 1, an encapsulation substrate 300b may be on the organic light-emitting diode OLED as a display element. The encapsulation substrate 300b may be arranged on the substrate 100 to face the substrate 100.

The substrate 100 may include a glass material. In one embodiment, for example, the substrate 100 may include a glass material mainly containing $SiO_2$. The organic light-emitting diode OLED may be covered by the encapsulation substrate 300b. The encapsulation substrate 300b may include a glass material. In one embodiment, for example, the encapsulation substrate 300b may include a glass material mainly containing $SiO_2$. The encapsulation substrate 300b may be arranged to face the substrate 100, and the sealant ST (shown in FIG. 4) may be between the substrate 100 and the encapsulation substrate 300b. In such an embodiment, the sealant ST may be located on the edge of the substrate 100 and may entirely surround the entire organic light-emitting diode OLED on the display area DA between the substrate 100 and the encapsulation substrate 300b.

In a display apparatus, if the thickness of a molybdenum (Mo) thin film is increased to accomplish high-resolution and low-resistance wiring, stress characteristics changes from a compressive stress to a tensile stress, and thus a substrate may be bent or broken.

In such a display apparatus, if aluminum (Al), copper (Cu), and silver (Ag) instead of molybdenum (Mo) are used, a dry etching process is impossible (e.g., when using Cu and Ag), or a Hillock phenomenon, in which a big or small protrusion is formed on the surface of a thin film, occurs (e.g., when using Al).

In an embodiment of a display apparatus according to an the disclosure, a molybdenum (Mo) thin film is formed on a tungsten (W) thin film since the molybdenum (Mo) thin film and the tungsten (W) thin film provide opposite stress characteristics, such that the stress of the molybdenum (Mo) thin film may be reduced, and thus the thickness of molybdenum (Mo) may be stably increased, thereby realizing low-resistance wiring. In one embodiment, for example, because each of a scan line, a light-emission control line, a gate electrode, a lower electrode, an upper electrode, and the like includes a lower layer including tungsten (W) or a tungsten alloy and an upper layer including molybdenum (Mo), the stress of a molybdenum (Mo) thin film may be reduced, and thus the thickness of molybdenum (Mo) may be stably increased, thereby realizing low-resistance wiring.

According to an embodiment as described above, a display apparatus may be realized in which a gate electrode of a thin-film transistor and/or an electrode of a storage capacitor have improved resistances.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:
1. A display apparatus comprising:
   a substrate;
   a thin-film transistor on the substrate, wherein the thin-film transistor includes a semiconductor layer and a gate electrode overlapping the semiconductor layer with a first insulating layer between the gate electrode and the semiconductor layer; and
   a display element electrically connected to the thin-film transistor,
   wherein the gate electrode includes: a first lower layer; and a first upper layer on the first lower layer and including a different material from the first lower layer, and the first lower layer has a first thickness from an upper surface of the first insulating layer, the first upper layer has a second thickness from an upper surface of the first lower layer, wherein the second thickness is greater than the first thickness, wherein the first lower layer includes tungsten (W) or a tungsten alloy, and the first upper layer includes molybdenum (Mo), wherein the tungsten alloy of the first lower layer includes tungsten (W) and a first element, an amount of the first element in the tungsten alloy is less than about 50 wt %, and the first element is selected from titanium (Ti), zirconium (Zr) and hafnium (Hf).

2. The display apparatus of claim 1, wherein the first thickness is in a range of about 250 Å to about 1200 Å, and the second thickness is in a range of about 2000 Å to about 7000 Å.

3. The display apparatus of claim 1, further comprising:

a storage capacitor including:

the gate electrode; and an upper electrode overlapping the gate electrode with a second insulating layer between the upper electrode and the gate electrode.

4. The display apparatus of claim 3, wherein the upper electrode includes: a second lower layer; and a second upper layer on the second lower layer and including a different material from the second lower layer, the second lower layer has a third thickness from an upper surface of the second insulating layer, and the second upper layer has a fourth thickness from an upper surface of the second lower layer, wherein the fourth thickness is greater than the third thickness.

5. The display apparatus of claim 4, wherein the second lower layer includes tungsten (W) or a tungsten alloy, the second upper layer includes molybdenum (Mo), the third thickness is in a range of about 250 Å to about 1200 Å, and the fourth thickness is in a range of about 2000 Å to about 7000 Å.

6. The display apparatus of claim 5, wherein the tungsten alloy of the second lower layer includes tungsten (W) and a second element, an amount of the second element in the tungsten alloy is less than 50 wt %, and the second element is selected from titanium (Ti), zirconium (Zr) and hafnium (Hf).

7. The display apparatus of claim 1, further comprising:

a storage capacitor including:

a lower electrode on the substrate; and an upper electrode overlapping the lower electrode with a second insulating layer between the upper electrode and the lower electrode.

8. The display apparatus of claim 7, wherein the lower electrode is spaced apart from the gate electrode.

9. The display apparatus of claim 1, wherein the gate electrode further includes: a third lower layer on the first upper layer; and a third upper layer on the third lower layer and including a different material from the third lower layer, the third lower layer has a fifth thickness from an upper surface of the first upper layer, and the third upper layer has a sixth thickness from an upper surface of the third lower layer, wherein the sixth thickness is greater than the fifth thickness.

10. The display apparatus of claim 9, wherein each of the first thickness and the fifth thickness is in a range of about 250 Å to about 600 Å, and each of the second thickness and the sixth thickness is in a range of about 2000 Å to about 3500 Å.

11. The display apparatus of claim 1, wherein the display element comprises:

a pixel electrode electrically connected to the thin-film transistor;

an intermediate layer on the pixel electrode; and an opposite electrode on the intermediate layer.

12. The display apparatus of claim 1, wherein the substrate comprises a glass material or a polymer resin.

13. A display apparatus comprising:

a substrate;

a first insulating layer on the substrate; and a gate electrode on the first insulating layer, wherein the gate electrode includes:

a plurality of first lower layers including tungsten (W) or a tungsten alloy; and a plurality of first upper layers including molybdenum (Mo), wherein the plurality of first lower layers is alternately stacked with the plurality of first upper layers, and one of the plurality of first lower layers is closest to the substrate, wherein the tungsten alloy of the gate electrode includes tungsten (W) and a first element, an amount of the first element in the tungsten alloy is less than about 50 wt %, and the first element is selected from titanium (Ti), zirconium (Zr) and hafnium (Hf).

14. The display apparatus of claim 13, wherein a thickness of each of the plurality of first upper layers is greater than a thickness of each of the plurality of first lower layers.

15. The display apparatus of claim 14, wherein a thickness of the gate electrode is in a range of about 2250 Å to about 8200 Å.

16. The display apparatus of claim 13, further comprising:

a storage capacitor including:

the gate electrode; and an upper electrode overlapping the gate electrode with a second insulating layer between the upper electrode and the gate electrode.

17. The display apparatus of claim 16, wherein the upper electrode is on the second insulating layer, the upper electrode includes: a plurality of second lower layers including tungsten (W) or a tungsten alloy; and a plurality of second upper layers including molybdenum (Mo), the plurality of second lower layers is alternately stacked with the plurality of second upper layers, and one of the plurality of second lower layers is closest to the substrate.

18. The display apparatus of claim 17, wherein a thickness of each of the plurality of second upper layers is greater than a thickness of each of the plurality of second lower layers.

19. The display apparatus of claim 18, wherein a thickness of the upper electrode is in a range of about 2250 Å to about 8200 Å.

20. The display apparatus of claim 17, wherein
the tungsten alloy of the upper electrode includes tungsten (W) and a second element,
an amount of the second element in the tungsten alloy is less than about 50 wt %, and
the second element is selected from titanium (Ti), zirconium (Zr) and hafnium (Hf).

21. The display apparatus of claim 13, further comprising:
a storage capacitor including:
a lower electrode on the substrate; and
an upper electrode overlapping the lower electrode with a second insulating layer between the upper electrode and the lower electrode.

22. The display apparatus of claim 21, wherein the lower electrode is spaced apart from the gate electrode.

* * * * *